(12) United States Patent
Zhang et al.

(10) Patent No.: US 12,010,876 B2
(45) Date of Patent: Jun. 11, 2024

(54) DISPLAY SUBSTRATE AND MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xin Zhang, Beijing (CN); Yang Zhou, Beijing (CN); Yupeng He, Beijing (CN); Xiaofeng Jiang, Beijing (CN); Meng Zhang, Beijing (CN); Lu Bai, Beijing (CN); Yi Qu, Beijing (CN); Huijun Li, Beijing (CN); Lulu Yang, Beijing (CN); Pengfei Yu, Beijing (CN); Hao Zhang, Beijing (CN); Mengqi Wang, Beijing (CN)

(73) Assignees: Chengdu BOE Optoelectronics Technology Co., Ltd., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 760 days.

(21) Appl. No.: 17/252,427

(22) PCT Filed: Mar. 18, 2020

(86) PCT No.: PCT/CN2020/080074
§ 371 (c)(1),
(2) Date: Dec. 15, 2020

(87) PCT Pub. No.: WO2021/184273
PCT Pub. Date: Sep. 23, 2021

(65) Prior Publication Data
US 2022/0052134 A1    Feb. 17, 2022

(51) Int. Cl.
H10K 59/122 (2023.01)
H10K 50/844 (2023.01)
H10K 59/131 (2023.01)

(52) U.S. Cl.
CPC ........ H10K 59/122 (2023.02); H10K 50/844 (2023.02); H10K 59/131 (2023.02)

(58) Field of Classification Search
None
See application file for complete search history.

(56) References Cited

U.S. PATENT DOCUMENTS 10,193,102 B2   1/2019   Kanaya
10,586,945 B2   3/2020   Kanaya
(Continued)

FOREIGN PATENT DOCUMENTS

CN    107527551 A   12/2017
CN    108288634     7/2018
(Continued)

OTHER PUBLICATIONS

Office action from Chinese Application No. 202080000289.0 dated Aug. 3, 2022.
Written Opinion from PCT/CN2010/080074 dated Dec. 11, 2020.

Primary Examiner — Cory W Eskridge
(74) Attorney, Agent, or Firm — Calfee, Halter & Griswold LLP

(57) ABSTRACT

Provided are a display substrate and a manufacturing method thereof, and a display device. The display substrate includes: a base substrate; a drive circuit layer formed on the base substrate and including an interlayer dielectric layer at the display region and the transition region; display parts at the display region, including a first electrode and a pixel definition portion sequentially formed on the interlayer dielectric layer; a first packaging dam and a second packaging dam at the transition region and around the opened (Continued)

region, each including a protective portion and a blocking portion sequentially laminated on the interlayer dielectric layer. The second packaging dam is at a side of the first packaging dam away from the display region, and a thickness of the second packaging dam is greater than that of the first packaging dam.

18 Claims, 15 Drawing Sheets

(56) References Cited

U.S. PATENT DOCUMENTS

| | | | |
|---|---|---|---|
| 2016/0204373 A1* | 7/2016 | Park | H10K 59/124 |
| | | | 257/40 |
| 2018/0151834 A1 | 5/2018 | Kanaya | |
| 2018/0151843 A1 | 5/2018 | Kanaya | |
| 2019/0123298 A1 | 4/2019 | Kanaya | |
| 2020/0006697 A1* | 1/2020 | Jung | H10K 59/1213 |
| 2020/0176708 A1 | 6/2020 | Kanaya | |
| 2020/0203660 A1* | 6/2020 | Shi | H10K 77/10 |

FOREIGN PATENT DOCUMENTS

| | | |
|---|---|---|
| CN | 108538899 | 9/2018 |
| CN | 109888124 | 6/2019 |
| CN | 110034239 A | 7/2019 |
| CN | 110190104 | 8/2019 |
| CN | 110265583 | 9/2019 |
| CN | 110828687 A | 2/2020 |
| CN | 108538899 B | 7/2020 |

* cited by examiner

DISPLAY SUBSTRATE AND MANUFACTURING METHOD THEREOF, AND DISPLAY DEVICE

RELATED APPLICATIONS

This application is based on International Application No. PCT/CN2020/080074, filed on Mar. 18, 2020, the entire contents of which are incorporated herein by reference in its entirety.

TECHNICAL FIELD

Embodiments of the present disclosure relates to the technical field of display, and in particular, to a display substrate and a manufacturing method thereof, and a display device.

BACKGROUND

With improvement of science and technology, special-shaped screens and full screens have been gradually used in recent years. Both the special-shaped screens and the full screens are directed to improve screen percentage of the display device. Thus, it is necessary to reserve some aperture areas (for example, openings) for additional components, such as cameras, sensors, and the like, in some positions of the display screen so as to achieve a high screen percentage.

With development and update of display technologies, organic electroluminance displays (OLED) have already been mainstream products in the display field because of characteristics such as self-luminescence, high brightness, high contract, and low working voltage, and suitable for manufacturing the flexible screens.

However, for OLED display panels, moisture and oxygen may go into the display screen from an opening position along the light-emitting layer, to cause corrosion of inside of the display screen, and thus lead to display failure.

SUMMARY

Embodiment of the present disclosure provide a display substrate and a manufacturing method thereof, and a display device, which can prevent moisture and oxygen from entering a display area through an aperture in an opening area, such that the service life can be prolonged and the display effect of products can be improved.

In an embodiment of the present disclosure, a display substrate is provided. The display substrate has a display area, an opening area, and a transition area between the display area and the opening area, the transition area is disposed around the opening area; wherein the display substrate includes:
  a base substrate;
  a drive circuit layer formed on the base substrate, and including an interlayer dielectric layer at the display area and the transition area;
  display parts located at the display area, and including a first electrode and a pixel definition portion sequentially formed on the interlayer dielectric layer;
  a first packaging dam located at the transition area and disposed around the opening area, in which the first packaging dam includes a first protective portion and a first blocking portion sequentially laminated on the interlayer dielectric layer;
  a second packaging dam located at the transition area and disposed around the opening area, in which the second packaging dam is at a side of the first packaging dam far away from the display area, a thickness of the second packaging dam is greater than that of the first packaging dam, and the second packaging dam includes a second protective portion and a second blocking portion sequentially laminated on the interlayer dielectric layer; wherein
  the first blocking portion, the second blocking portion, and the pixel definition portion are arranged on the same layer, and are disconnected from each other; and
  a distance between the first packaging dam and the second packaging dam is less than a distance between the first packaging dam and the display area.

In an exemplary embodiment of the present disclosure, a thickness of the second protective portion is greater than a thickness of the first protective portion.

In an exemplary embodiment of the present disclosure, the first protective portion and the first electrode are arranged on the same layer, and are disconnected from each other.

In an exemplary embodiment of the present disclosure, the display substrate further includes a planarization portion located at the display area and formed between the interlayer dielectric layer and the first electrode;
  wherein the first protective portion and the planarization portion are arranged on the same layer, and are disconnected from each other.

In an exemplary embodiment of the present disclosure, the second protective portion and the first protective portion are arranged on the same layer.

In an exemplary embodiment of the present disclosure, the display substrate further includes a planarization portion located at the display area and formed between the interlayer dielectric layer and the first electrode;
  wherein the second protective portion and the planarization portion are arranged on the same layer, and are disconnected from each other.

In an exemplary embodiment of the present disclosure, at least one of the first packaging dam and the second packaging dam further includes a photo spacer formed at a side of the first blocking portion or the second blocking portion back away from the interlayer dielectric layer;
  the display parts further include a supporting portion formed at a side of the pixel definition portion back away from the base substrate, the supporting portion and the photo spacer being arranged on the same layer.

In an exemplary embodiment of the present disclosure, the display substrate further includes an isolation area between the display area and the transition area, the isolation area being disposed around the transition area;
  the display substrate further includes an isolation column formed at a side of the interlayer dielectric layer back away from the base substrate and located at the isolation area, in which the isolation column is disposed around the first packaging dam, and the isolation column is provided with a groove at a sidewall thereof.

In an exemplary embodiment of the present disclosure, the drive circuit layer includes a thin film transistor at the display area, a source electrode and a drain electrode of the thin film transistor and the isolation column are arranged on the same layer, and are disconnected from each other.

In an exemplary embodiment of the present disclosure, the display substrate further includes an inner-ring wiring area between the isolation area and the display area, the inner-ring wiring area being disposed around the isolation area;

the drive circuit layer further includes an inner-ring signal line at the inner-ring wiring area, in which the inner-ring signal line is electrically connected to a signal wiring of the display area.

In an exemplary embodiment of the present disclosure, the isolation column includes a first metal layer, a second metal layer and a third metal layer sequentially laminated on the interlayer dielectric layer, an outer boundary of an orthographic projection of the second metal layer on the interlayer dielectric layer is inside an outer boundary of orthographic projections of the first metal layer and the third metal layer on the interlayer dielectric layer, to form the groove at the sidewall of the isolation column.

In an exemplary embodiment of the present disclosure, the first metal layer and the third metal layer are titanium layers, and the second metal layer is an aluminum layer.

In an exemplary embodiment of the present disclosure, the drive circuit layer includes a first slot and a second slot at the isolation area; in which the first slot is at a side of the isolation column close to the first packaging dam, and the first slot is disposed around the first packaging dam; the second slot is at a side of the isolation column close to the display area, and the second slot is disposed around the first slot;
 wherein the first slot and the second slot penetrate through the drive circuit layer.

In an exemplary embodiment of the present disclosure, the display substrate further includes a packaging layer includes a first inorganic packaging film layer, an organic packaging film layer and a second inorganic packaging film layer which are sequentially laminated;
 the first inorganic packaging film layer and the second inorganic packaging film layer are configured to package the first packaging dam, the second packaging dam and the display parts;
 the organic packaging film layer is configured to package the display parts, and configured to be interrupted at a side of the first packaging dam close to the display area.

In an embodiment of the present disclosure, a manufacturing method of a display substrate is further provided. The display substrate includes a display area, an opening area, and a transition area between the display area and opening area, and the transition area is disposed around the opening area; wherein the manufacturing method includes:
 providing a base substrate;
 forming a drive circuit layer on the base substrate, in which the drive circuit layer includes an interlayer dielectric layer at the display area and the transition area;
 forming display parts, a first packaging dam and a second packaging dam at a side of the interlayer dielectric layer back away from the base substrate; wherein the display parts are located at the display area, and includes a first electrode and a pixel definition portion sequentially formed on the interlayer dielectric layer; the first packaging dam is located at the transition area and disposed around the opening area, and the first packaging dam includes a first protective portion and a first blocking portion sequentially laminated on the interlayer dielectric layer; the second packaging dam is located at the transition area and disposed around the opening area, the second packaging dam is located at a side of the first packaging dam far away from the display area, a thickness of the second packaging dam is greater than that of the first packaging dam, the second packaging dam includes a second protective portion and a second blocking portion sequentially laminated on the interlayer dielectric layer; wherein
 the first blocking portion, the second blocking portion and the pixel definition portion, which are disconnected from each other, are formed by using the same one-time patterning process;
 a distance between the first packaging dam and the second packaging dam is less than a distance between the first packaging dam and the display area.

In an exemplary embodiment of the present disclosure, the first protective portion and the first electrode disconnected from each other are formed by using the same patterning process.

In an exemplary embodiment of the present disclosure, the first protective portion and the planarization portion disconnected from each other are formed by using the same one-time patterning process, the planarization portion is located at the display area and formed between the interlayer dielectric layer and the first electrode.

In an exemplary embodiment of the present disclosure, the second protective portion and the first protective portion disconnected from each other are formed by using the same one-time patterning process.

In an exemplary embodiment of the present disclosure, the second protective portion and planarization portion disconnected from each other are formed by using the same patterning process, the planarization portion is located at the display area and formed between the interlayer dielectric layer and the first electrode.

In an exemplary embodiment of the present disclosure, the display substrate further includes an isolation area between the display area and the transition area, and the isolation area is disposed around the transition area; wherein the manufacturing method further includes:
 forming an isolation column of the isolation area at a side of the interlayer dielectric layer back away from the base substrate, in which the isolation column is disposed around the transition area, and a sidewall of the isolation column is provided with a groove.

In an exemplary embodiment of the present disclosure, the drive circuit layer includes a thin film transistor at the display area, in which the thin film transistor includes a source electrode and a drain electrode;
 wherein the source electrode, the drain electrode and the isolation column disconnected from each other are formed by using the same patterning process.

In an exemplary embodiment of the present disclosure, the display substrate further includes an inner-ring wiring area between the isolation area and the display area, in which the inner-ring wiring area is disposed around the isolation area; the drive circuit layer further includes an inner-ring signal line located at the inner-ring wiring area, in which the inner-ring signal line is electrically connected to a signal wiring of the display area.

In an exemplary embodiment of the present disclosure, after forming display parts, a first packaging dam and a second packaging dam at a side of the interlayer dielectric layer back away from the base substrate, the manufacturing method further includes:
 forming a packaging layer including a first inorganic packaging film layer, an organic packaging film layer and a second inorganic packaging film layer which are sequentially laminated;
 packaging the first packaging dam, the second packaging dam and the display parts by the first inorganic packaging film layer and the second inorganic packaging film layer;

packaging the display parts by the organic packaging film layer, and interrupting the organic packaging film layer at a side of the first packaging dam close to the display area.

In an embodiment of the present disclosure, a display device is also provided. The display device includes the display substrate according to any one of the embodiments.

BRIEF DESCRIPTION OF THE DRAWINGS

The accompanying drawings are used to provide a further understanding of the embodiments of the present disclosure, and constitute a part of the specification. The drawings are used to explain the present disclosure together with the embodiments of the present disclosure, and do not constitute a limitation of the present disclosure. Detailed example embodiments are described with reference to the accompanying drawings. The above and other features and advantages will become more apparent to those skilled in the art. In the drawings.

Figure 1:
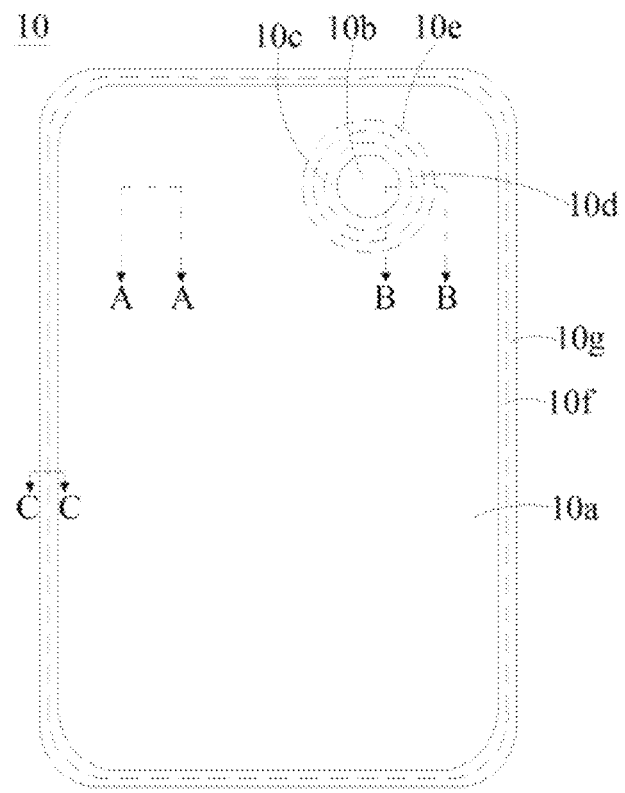
FIG. 1 is a schematic plan view of the display substrate in an embodiment of the present disclosure.

The technical features with reference numbers are as follows:

10. display substrate; 10a. display area; 10b. opening area; 10c. transition area; 10d. isolation area; 10e. inner-ring wiring area; 10f. peripheral wiring area; 10g. peripheral packaging area; 101. polyimide layer; 102. buffer layer; 103. interlayer dielectric layer; 104. active layer; 105. first gate insulating layer; 106. gate electrode; 107. peripheral wiring; 108. second gate insulating layer; 109a. first peripheral transfer line; 109b. second peripheral transfer line; 110. source electrode; 111. drain electrode; 112. first electrode; 113. pixel definition portion; 114. light-emitting material layer; 114a. light-emitting portion; 115. second electrode; 116. planarization portion; 116a. first planarization film layer; 116b. second planarization film layer; 117. first blocking portion; 118. packaging layer; 118a. first inorganic packaging film layer; 118b. organic packaging film layer; 118c. second inorganic packaging film layer; 119. first protective portion; 120. second protective portion; 121. second blocking portion; 122. first photo spacer; 123. second photo spacer; 124. isolation column; 124a. groove; 124b. first metal layer; 124c. second metal layer; 124d. third metal layer; 125. first slot; 126. second slot; 127. first peripheral packaging dam; 127a. first peripheral blocking portion; 127b. first peripheral photo spacer; 128. second peripheral packaging dam; 128a. third protective portion; 128b. second peripheral blocking portion; 128c. first peripheral photo spacer; 129a. first inner-ring signal line; 129b. second inner-ring signal line; 129c. third inner-ring signal line; 130. first electrode plate; 131. second electrode plate; 132. supporting portion; 133. transfer electrode; 134. passivation film layer; 135. blocking wall; 136. first film layer; 137. second film layer; 138. third film layer; 139. organic insulating packaging portion; 140. first pattern block; 141. second pattern block; 1a. first packaging dam; 1b. second packaging dam; 1c. third packaging dam; 1d. light-emitting sub-pixel; 20. functional element; 30. drive chip.

DETAILED DESCRIPTION

Hereinafter, the technical solutions of the present disclosure will be further specifically described with reference to embodiments and in conjunction with the accompanying drawings. In the specification, the same or similar reference numbers indicate the same or similar components. The description of the embodiments of the present disclosure with reference to the drawings is intended to explain a generic concept of the present disclosure, and should not be construed as limiting the present disclosure.

In addition, for convenience of explanation, many specific details below are set forth to provide a comprehensive understanding of the embodiments of the present disclosure. However, it should be appreciated that one or more embodiments could also be implemented without providing those specific details thereof.

It should be explained that "on", "formed on" and "disposed on" herein may be referred to that one layer is directly formed or disposed on another layer, or that one layer is indirectly formed or disposed on another layer, that is, there are other layers between these two layers.

The terms "a", "an", "the", "said" and "at least one", are used to express the presence of one or more the element/constitute/or the like. The terms "comprise", "include" and "have" are intended to be inclusive, and mean there may be additional elements/constituents/or the like other than the listed elements/constituents/or the like.

It should be noted that, although the terms "first", "second", etc. may be used herein to describe various components, members, elements, areas, layers and/or parts, these components, members, elements, areas, layers and/or parts should not be restricted by these terms. Instead, these terms are used to distinguish one component, member, element, area, layer and/or part from another component, member, element, area, layer and/or part.

In the present disclosure, unless otherwise stated, the term "arranged on the same layer" refers to that two layers, components, members, elements or parts may be formed by the same patterning process, and the two layers, components, members, elements, or parts are generally formed of the same material.

In the present disclosure, unless otherwise stated, the expression "patterning process" generally includes steps of photoresist coating, exposure, development, etching, and photoresist stripping. The expression "one-time/same composition process" means a process of using one/same mask plate to form patterned layers, components, members, etc.

An embodiment of the present disclosure provides a display substrate which may be an OLED display substrate. As shown in FIG. 1, the display substrate 10 may have a display area 10a, an opening area 10b, and a transition area 10c between the display area 10a and the opening area 10b. The transition area 10c is disposed around the opening area 10b. It should be noted that the display substrate 10 may further include an isolation area 10d, an inner-ring wiring area 10e, a peripheral wiring area 10f, and a peripheral packaging area 10g. The isolation area 10d is located between the display area 10a and the transition area 10c and disposed around the transition area 10c. The inner-ring wiring area 10e is located between the isolation area 10d and the display area 10a and disposed around the isolation area 10d. The peripheral wiring area 10f may be disposed around the display area 10a or disposed on both sides of the display area 10a. The peripheral packaging area 10g may package the entire display substrate 10 at an outermost edge of an entire base substrate.

Specifically, the display substrate may include a base substrate, a drive circuit layer, display parts, a first packaging dam, and a second packaging dam.

The base substrate may be a flexible substrate to improve flexibility of the display substrate 10, so that the display substrate 10 may be bent and folded to expand an application range of the display substrate 10, which however is not limited thereto. The base substrate may also be rigid, and specifically, the performance of the base substrate can be determined according to the actual requirements of the product.

Figure 2:
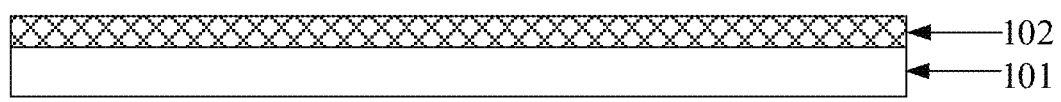
FIG. 2 is a schematic view of the base substrate in an embodiment of the present disclosure.

In addition, the base substrate may have a single-layer structure or a multi-layer structure. For example, as shown in FIG. 2, the base substrate may include a polyimide layer 101 and a buffer layer 102 that are sequentially laminated. In some other embodiments, the base substrate may include a polyimide layer 101 and a buffer layer 102 that are sequentially laminated. The buffer layer 102 may be made of silicon nitride, silicon oxide and other materials to achieve effect of blocking moisture and oxygen as well as blocking alkali ions. It should be noted that the structure of the base substrate is not limited thereto, and can be determined according to actual requirements.

It should be noted that for convenience of subsequently processing the required components in various areas of the display substrate 10, various areas may be firstly defined on the base substrate. For example, the base substrate is firstly divided into a display area 10a, a transition area 10c, an opening area 10b, an isolation area 10d, an inner-ring wiring area 10e, a peripheral wiring area 10f, a peripheral packaging area 10g, that is, the entire display substrate 10 is divided into a display area 10a, a transition area 10c, an opening area 10b, an isolation area 10d, an inner-ring wiring area 10e, a peripheral wiring area 10f, and a peripheral packaging area 10g.

The drive circuit layer may be formed on the base substrate. For example, as shown in FIGS. 3 to 6, 9A, 9B, and 11, the drive circuit layer may be formed on the buffer layer 102. The drive circuit layer may include an interlayer dielectric layer 103 at the display area 10a and the transition area 10c, and the interlayer dielectric layer 103 is made of inorganic materials, such as silicon oxide, silicon nitride and other inorganic materials to achieve the effect of blocking moisture and oxygen as well as blocking alkaline ions. It should be understood that, when the display substrate 10 has an isolation area 10d, an inner-ring wiring area 10e, a peripheral wiring area 10f, and a peripheral packaging area 10g, the interlayer dielectric layer 103 is also located at the isolation area 10d, the inner-ring wiring area 10e, the peripheral wiring area 10f, and the peripheral packaging area 10g.

In detail, a portion of the drive circuit layer in the display area 10a may include a thin film transistor and a capacitor structure.

Figure 3:
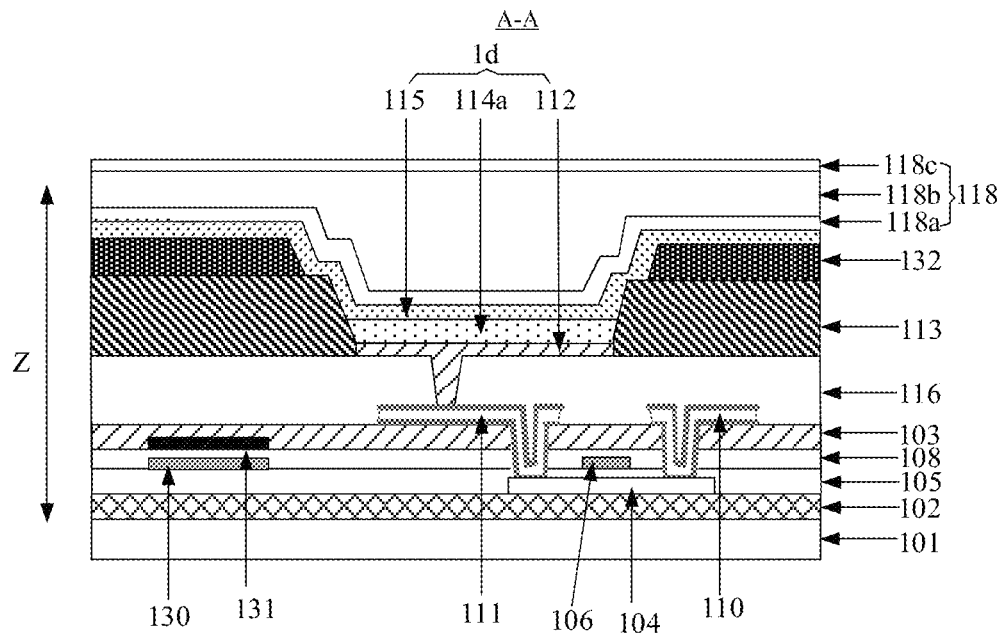
FIG. 3 is a cross-sectional view of the display substrate in the A-A direction of an embodiment shown in FIG. 1.

As shown in FIG. 3, the thin film transistor may be of a top-gate type, and may include an active layer 104, a first gate insulating layer 105, a gate electrode 106, a second gate insulating layer 108, an interlayer dielectric layer 103, a source electrode 110, and a drain electrode 111. Specifically, the active layer 104 may be formed on the buffer layer 102; the first gate insulating layer 105 covers the buffer layer 102 and the active layer 104; the gate electrode 106 is formed at a side of the first gate insulating layer 105 back away from the active layer 104; the second gate insulating layer 108 covers the gate electrode 106 and the first gate insulating layer 105; the interlayer dielectric layer 103 covers the second gate insulating layer 108; the source electrode 110 and the drain electrode 111 are formed at a side of the interlayer dielectric layer 103 back away from the base substrate and are respectively located on opposite sides of the gate electrode 106. The source electrode 110 and the drain electrode 111 may respectively contact with opposite sides of the active layer 104 through via holes (such as metal via holes). It should be understood that the thin film transistor may also be of a bottom-gate type.

As shown in FIG. 3, the capacitor structure may include a first electrode plate 130 and a second electrode plate 131. The first electrode plate 130 and the gate electrode 106 are arranged on the same layer; and the second electrode plate 131 is located between the second gate insulating layer 108 and the interlayer dielectric layer 103 and arranged opposite to the first electrode plate 130.

For example, materials of the gate electrode 106, the first electrode plate 130, and the second electrode plate 131 may include metal materials or alloy materials, such as molybdenum, aluminum, and titanium. The source electrode 110 and the drain electrode 111 may include a metal single-layer structure or a multi-layer structure formed by a metal material or an alloy material, such as molybdenum, aluminum, and titanium. For example, the multi-layer structure is a metal multi-layer lamination, for example a titanium-aluminum-titanium three-layer metal lamination (Al/Ti/Al).

It should be noted that as shown in FIGS. 3 to 6, 9A, 9B, and 11, the first gate insulating layer 105 and the second gate insulating layer 108 as above mentioned are also located at the transition area 10c, the isolation area 10d, the inner-ring wiring area 10e, the peripheral wiring area 10f, and the peripheral packaging area 10g.

As shown in FIG. 3, the display parts are located in the display area. The display parts may include a first electrode 112 and a pixel definition portion 113 that are sequentially formed on the interlayer dielectric layer 103. It should be understood that the display part may also include a light-emitting portion 114a and a second electrode 115.

In detail, when the thin film transistor of the display area 10a is of a top-gate type, a planarization layer may also be manufactured before manufacturing the display parts. The planarization layer may be a single-layer structure or a multi-layer structure. The planarization layer may usually be made of an organic material, such as a photoresist, an acrylic-based polymer, a silicon-based polymer, and the like. As shown in FIG. 3, the planarization layer may include a planarization portion 116 at the display area 10a, and the planarization portion 116 is formed between the interlayer dielectric layer 103 and the first electrode 112. The first electrode 112 may be electrically connected to the drain electrode 111 through a metal via hole. The first electrode 112 may be an anode that may be made of ITO (indium tin oxide), indium zinc oxide (IZO), zinc oxide (ZnO), and other materials. The pixel definition portion 113 may cover the planarization portion 116 and may be made of an organic material, such as a photoresist and other organic materials, and a part of the pixel definition portion 113 located in the display area 10a may have a pixel aperture that exposes the first electrode 112. The light-emitting portion 114a is located in the pixel aperture and formed on the first electrode 112. The light-emitting portion 114a may include a small molecular organic material or a polymer molecular organic material, which may be a fluorescent light-emitting material or a phosphorescent light-emitting material, and may emit red light, green light, blue light, or white light, for example. In addition, according to different actual requirements, in different examples, the light-emitting portion 114a may further include a functional layer such as an electron injection layer, an electron transport layer, a hole injection layer and a hole transport layer. The second electrode 115 covers the light-emitting portion 114a. A polarity of the second electrode 115 is opposite to that of the first electrode 112. The second electrode 115 may be a cathode that may be made of lithium (Li), aluminum (Al), magnesium (Mg), silver (Ag) and other metal materials.

It should be noted that as shown in FIG. 3, the first electrode 112, the light-emitting portion 114a, and the second electrode 115 may constitute a light-emitting sub-pixel 1d. A part of the display part located in the display area 10a may include a plurality of light-emitting sub-pixels 1d arranged in an array. In addition, it should be noted that the first electrodes 112 of light-emitting sub-pixels 1d are independent of one another, and the second electrodes 115 of the light-emitting sub-pixels 1d are connected on the whole surface, that is, the second electrode 115 is a whole structure disposed on the display substrate 10 and is a common electrode for a plurality of display parts.

In some embodiments, as shown in FIG. 3, a supporting portion 132 may be provided at a side of the pixel definition portion 113 back away from the interlayer dielectric layer 103. The supporting portion 132 may function to support the protective film layer (not shown) to avoid such circumstance that the first electrode 112 or other wirings are easily damaged because the protective film layer is in contact with the first electrode 112 or other wirings. It should be noted that the protective film layer mainly appears in the transfer process of a semi-finished product to avoid the semi-finished product from being damaged during the transfer process. Specifically, a protective film layer may be covered in the process of transferring the substrate by which the supporting portion 132 has been manufactured to an evaporation production line, and the protective film layer is removed when the evaporation of the light-emitting material is required.

For example, a material of the supporting portion 132 may be the same as that of the pixel definition portion 113, and the supporting portion 132 and the pixel definition portion 113 may be formed by the same one-time patterning process, but which is not limited thereto. That is, the material of the supporting portion 132 may also be different from that of the pixel definition portion 113, and the supporting portion 132 and the pixel definition portion 113 may also be formed by different patterning processes.

When the display substrate 10 has a peripheral wiring area 10f, the pixel definition portion 113 is also located in the peripheral wiring area 10f.

Figure 4:
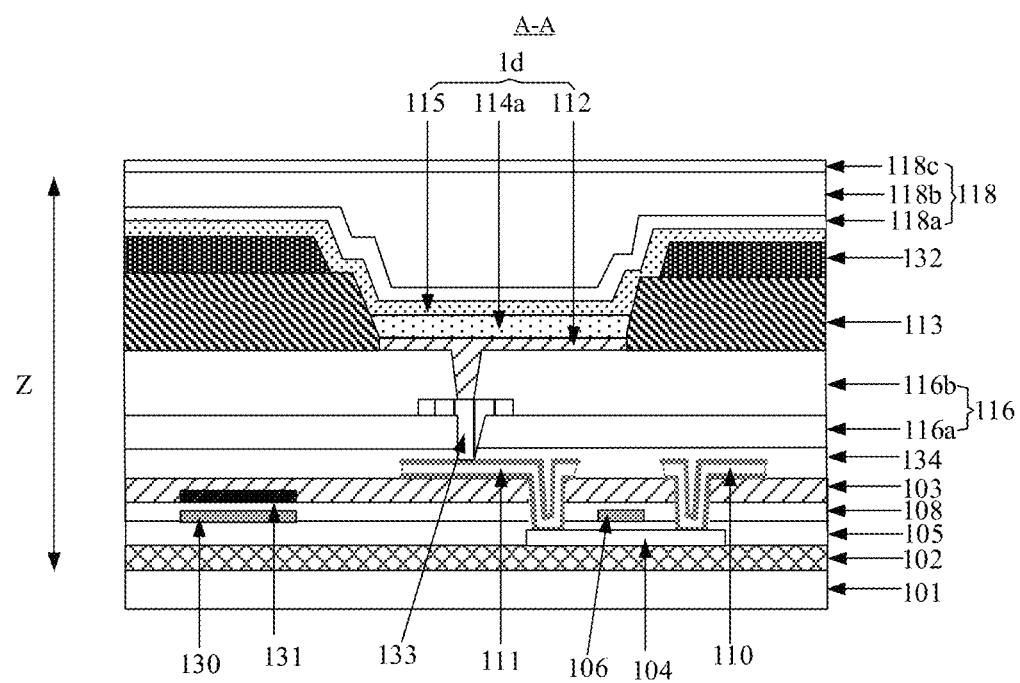
FIG. 4 is a cross-sectional view of the display substrate in the A-A direction of another embodiment shown in FIG. 1.

In some embodiments, as shown in FIG. 4, the first electrode 112 may also be electrically connected to the drain electrode 111 through a transfer electrode 133. When the first electrode 112 is electrically connected to the drain electrode 111 through the transfer electrode 133, the planarization portion 116 may have a double-layer structure, and specifically, may include a first planarization film (PLN1) layer 116a and a second planarization film (PLN2) layer 116b that are sequentially formed. In addition, a passivation film (PVX) layer 134 may also be formed between the first planarization film layer 116a and the interlayer dielectric layer 103. The passivation film layer 134 may be formed of a material such as silicon oxide, silicon nitride, or silicon oxynitride. The passivation film layer 134 covers the source electrode 110 and the drain electrode 111. It should be noted that when the planarization portion 116 is a single layer, a passivation film layer 134 may also be formed between the planarization portion 116 and the interlayer dielectric layer 103; and a transfer electrode 133 is formed between the first planarization film layer 116a and the second planarization film layer 116b, and is electrically connected to the drain electrode 111 sequentially through via holes (such as metal via holes) on the first planarization film layer 116a and the passivation film layer 134; and the first electrode 112 may be electrically connected to the transfer electrode 133 through a via hole (such as a metal via hole) on the second planarization film layer 116b, as shown in FIG. 4, which however is not limited thereto, and the transfer electrode 133 may also be formed between the first planarization film layer 116a and the passivation film layer 134.

Figure 5:
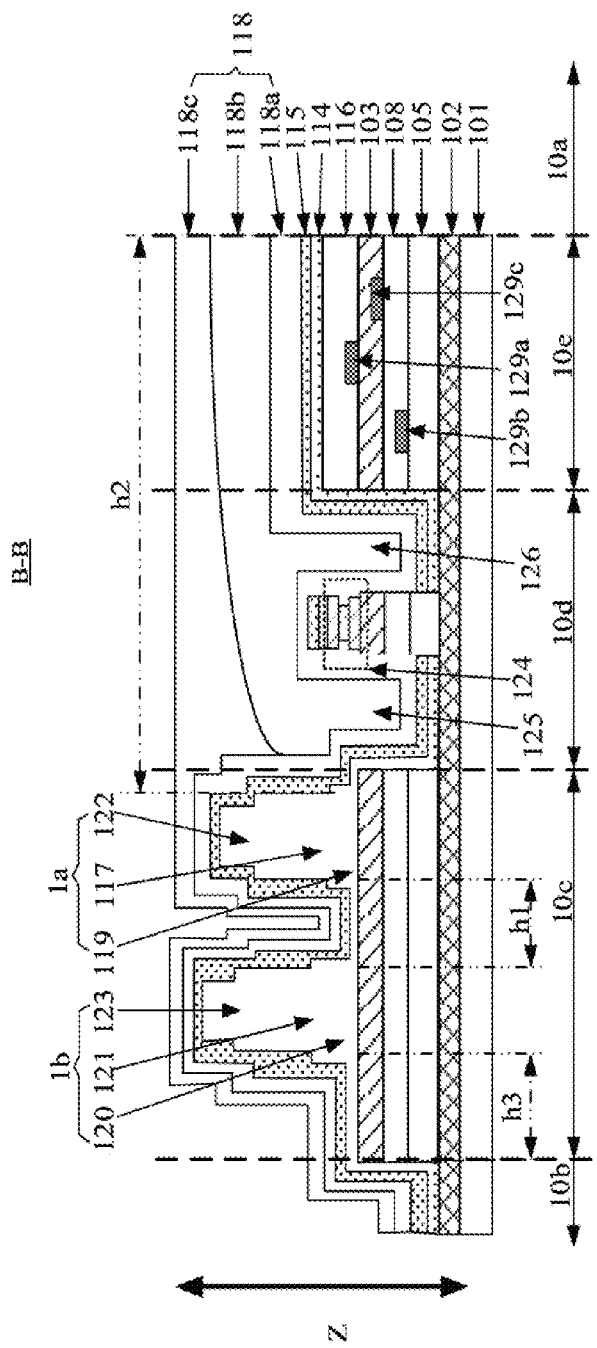
FIG. 5 is a cross-sectional view of the display substrate in the B-B direction of an embodiment shown in FIG. 1.

As shown in FIG. 5, the first packaging dam 1a is formed at a side of the interlayer dielectric layer 103 back away from the base substrate, located at the transition area 10c, and disposed around the opening area 10b. In the embodiment of the present disclosure, the first packaging dam 1a may include a first blocking portion 117. When the display substrate 10 is packaged by the packaging layer 118, the first blocking portion 117 is capable of restricting the flow of material of the organic packaging film layer in the packaging layer 118 to prevent the material of the organic packaging film layer in the packaging layer 118 from flowing to the opening area 10b and thereby causing the packaging failure. That is, the first blocking portion 117 of the first packaging dam 1a may cooperate with the packaging layer 118 to effectively block moisture and oxygen from entering the display area 10a through the opening area 10b, so as to prevent the failure of the light-emitting portion 114a of the display area 10a to cause a poor display effect, and prolong the service life of the product.

In detail, as shown in FIGS. 3 to 5, the packaging layer 118 of the display substrate 10 may include a first inorganic packaging film layer 118a, an organic packaging film layer 118b, and a second inorganic packaging film layer 118c that are sequentially laminated. The first inorganic packaging film layer 118a packages the display parts, the first packaging dam 1a and the second packaging dam 1b. The organic packaging film layer 118b packages display parts and interrupted at a side of the first packaging dam 1a adjacent to the display area 10a. The second inorganic packaging film layer 118c packages display parts, the first packaging dam 1a and the second packaging dam 1b. The first inorganic packaging film layer 118a and the second inorganic packaging film layer 118c are used to prevent moisture and oxygen from entering the light-emitting portion 114a of the display area 10a from the display side with a display function and the opening area 10b. The first inorganic packaging film layer 118a and the second inorganic packaging film layer 118c may made of inorganic materials such as silicon nitride and silicon oxide, for example. The organic packaging film layer 118b is used to achieve planarization, so as to facilitate manufacturing the second inorganic packaging film layer 118c. The organic packaging film layer 118b may be made of a material such as acrylic-based polymer or silicon-based polymer.

The first inorganic packaging film layer 118a and the second inorganic packaging film layer 118c may be manufactured by using a chemical vapor deposition process, but which is not limited thereto, for example, also using a physical vapor deposition process. The organic packaging film layer 118b is manufactured by an inkjet printing process, but which is not limited thereto, for example, also by a spraying process. In the process of manufacturing the organic packaging film layer 118b, since the organic packaging material possesses a certain fluidity, the first blocking portion 117 is provided to restrict the flow of the organic packaging material, to avoid failure of the package because the organic packaging material flows to the opening area 10b.

In the embodiment of the present disclosure, the first blocking portion 117 and the pixel definition portion 113 are arranged on the same layer, that is, the first blocking portion 117 and the pixel definition portion 113 may be formed simultaneously by one-time patterning process, which can reduce the number of processing steps and the usage of mask plates, thereby reducing costs. In addition, it should be understood that the first blocking portion 117 and the pixel definition portion 113 should be disconnected from each other.

Since the first blocking portion 117 and the pixel definition portion 113 are arranged on the same layer, it can be seen that if the first blocking portion 117 is directly manufactured on the interlayer dielectric layer 103 of the transition area 10c, the surface of the interlayer dielectric layer 103 at the transition area 10c is cleaned by etching solutions (for example, nitric acid solution) of patterning processes of other layers (for example, patterning processes of the source/drain electrode, the planarization layer, the first electrode 112) before manufacturing the first blocking portion 117, so that a surface roughness of the interlayer dielectric layer 103 at the transition area 10c (that is, a smaller spacing and the unevenness of smaller peaks and valleys of the processing surface) becomes smaller, that is, becomes smoother. If the first blocking portion 117 is directly formed on the surface of the interlayer dielectric layer 103 at the transition area 10c, an adhesion force of the first blocking portion 117 on the interlayer dielectric layer 103 is reduced, and the first blocking portion 117 cannot be stably combined with the interlayer dielectric layer 103 of the transition area 10c. In the process that the first blocking portion 117 is formed by patterning, the first blocking portion 117 easily falls off during the cleaning process of the developer, that is, the first packaging dam 1a easily falls off from the interlayer dielectric layer 103 of the transition area 10c, to increase a risk of package failure.

In order to solve this problem, in the embodiment of the present disclosure, as shown in FIG. 5, the first packaging dam 1a further includes a first protective portion 119 formed on the interlayer dielectric layer 103, and the first blocking portion 117 aforementioned is provided at a side of the first protective portion 119 back away from the interlayer dielectric layer 103. That is, before the first packaging dam 1a is manufactured in the embodiment of the present disclosure, a first protective portion 119 may be firstly formed on the surface of the interlayer dielectric layer 103 at the transition area 10c, and then the first blocking portion 117 is formed at a side of the first protective portion 119 back away from the interlayer dielectric layer 103. By providing the first protective portion 119, the surface of the interlayer dielectric layer 103 at the transition area 10c can be protected before manufacturing the first blocking portion 117, so as to reduce the number of cleaning times of the interlayer dielectric layer 103 at the transition area 10c by the etching solution, thereby improving the adhesion force of the interlayer dielectric layer 103 at the transition area 10c, ensuring the bonding of the first packaging dam 1a and the interlayer dielectric layer 103, effectively reducing the risk of falling the first packaging dam 1a off during the process, and thus reducing the risk of packaging failure, improving a yield rate of packaging, and ensuring the display effect and the service life of the product.

In the transition area 10c, since the times that a surface of the interlayer dielectric layer covered with the first protective layer 119 is cleaned by the etching solution is less than the times that a surface of the interlayer dielectric layer uncovered with the first protective layer 119, a surface roughness of the interlayer dielectric layer 103 covered with the first protective layer 119 is greater than a surface roughness of the interlayer dielectric layer uncovered with the first protective layer 119. For example, a ratio between the surface roughness of the interlayer dielectric layer 103 covered with the first protective portion 119 and the surface roughness of the interlayer dielectric layer uncovered with the first protective portion 119 may be 100:5 to 100:95, 100:10 to 100:90, 100:20 to 100:80, 100:30 to 100:70, 100:40 to 100:60, or the like. It should be understood that a surface roughness is evaluated usually by using three height characteristic parameters of "average arithmetic deviation of a profile Ra", "average height of unevenness Rz" and "maximum height Ry".

In some embodiments of the present disclosure, the first protective portion 119 may be arranged on the same layer as the first electrode 112, that is, a first conductive film covering on the interlayer dielectric layer 103 and located at the display area 10a and the transition area 10c may be patterned by one-time patterning process to form the first protective portion 119 and the first electrode 112 simultaneously. Since the first conductive film covers the interlayer dielectric layer 103 at the transition area 10c, the interlayer dielectric layer 103 at the transition area 10c will not be cleaned by the etching solution during a patterning process to form the first electrode 112, thereby reducing the times that the interlayer dielectric layer 103 of the transition area 10c is cleaned by the etching solution, and thus improving the adhesion force of the interlayer dielectric layer 103 at the transition area 10c. Since during the formation of the first electrode 112, a first protective portion 119 is also formed at the same time, the interlayer dielectric layer 103 located at the transition area 10c also may be protected by the first protective portion 119, so as to prevent the etching solution of the subsequent patterning process from cleaning the interlayer dielectric layer 103 at the transition area 10c.

In addition, since the first protective portion 119 and the first electrode 112 are formed by the same patterning process, the number of processing steps and the usage of the mask plate may also be reduced, thereby reducing costs. In addition, it should be understood that the first protective portion 119 and the first electrode 112 should be disconnected from each other to avoid the first protective portion 119 being powered on during displaying.

In some embodiments of the present disclosure, the first protective portion 119 and the planarization portion 116 may be arranged on the same layer, that is, the planarization film covering on the interlayer dielectric layer 103 and located at the display area 10a and the transition area 10c may be patterned by one-time patterning process to form the first protective portion 119 and the planarization portion 116 simultaneously. The planarization film covers the interlayer dielectric layer 103 at the transition area 10c, so during the patterning process of forming the planarization portion 116, the interlayer dielectric layer 103 at the transition area 10c will not be cleaned by the etching solution in this process, which reduces the times that the interlayer dielectric layer 103 of the transition area 10c is cleaned by the etching solution, and improves the adhesion force of the interlayer dielectric layer 103 at the transition area 10c. Since a first protective portion 119 is further simultaneously formed in the process of forming the planarization portion 116, the interlayer dielectric layer 103 at the transition area 10c may be protected by the first protective portion 119, so as to prevent the etching solution of the subsequent patterning process from cleaning the interlayer dielectric layer 103 at the transition area 10c.

In addition, since the first protective portion 119 and the planarization portion 116 are formed by the same patterning process, the number of processing steps and the usage of mask plates may be reduced, thereby reducing costs. In addition, it should be understood that the first protective portion 119 and the planarization portion 116 should be disconnected from each other to avoid such circumstance that the failure of the components of the display area 10a is caused by transferring the moisture and oxygen into the planarization portion 116 of the display area 10a through the first protective portion 119.

As the first blocking portion 117 and the pixel definition portion 113 are arranged on the same layer, the material of the first blocking portion 117 is the same as that of the pixel definition portion 113, and may also be an organic material. In this embodiment, the first protective portion 119 and the planarization portion 116 are arranged on the same layer, so that the material of the first protective portion 119 is the same as that of the planarization portion 116, and may also be an organic material. The material of the first protective portion 119 may be the same as the material of the first blocking portion 117. This design can improve the bonding force between the first protective portion 119 and the first blocking portion 117, ensure the structural stability of the first packaging dam 1a, and prevent the first blocking portion 117 from falling off the first protective portion 119, so as to further reduce the risk of package failure, increase the yield rate of packaging, and ensure the display effect and product service life.

In an embodiment of the present disclosure, as shown in FIG. 5, the display substrate 10 further includes a second packaging dam 1b. The second packaging dam 1b is formed at a side of the interlayer dielectric layer 103 back away from the base substrate and located at the transition area 10c; and the second packaging dam 1b is located on at a side of the first packaging dam 1a far away from the display area 10a and disposed around the opening area 10b, wherein a thickness of the second packaging dam 1b is greater than a thickness of the first packaging dam 1a, in order to further restrict the flow of material of the organic packaging film layer of the packaging layer 118, to avoid such problem that failure of the package is caused due to that the material of the organic packaging film layer of the packaging layer 118 flows to the opening area 10b.

Specifically, as shown in FIG. 5, the second packaging dam 1b may include a second protective portion 120 and a second blocking portion 121 formed at a side of the second protective portion 120 back away from the interlayer dielectric layer 103. The second blocking portion 121 and the first blocking portion 117 are arranged on the same layer, that is, the second blocking portion 121, the first blocking portion 117 and the pixel definition portion 113 are simultaneously formed by one-time patterning process, which can reduce the number of processing steps and the usage of mask plates, and thereby reducing costs.

In addition, it should be understood that the first blocking portion 117 and the second blocking portion 121 should be disconnected from each other. This design can increase the blocking and packaging path, and thus, improve the packaging effect.

As the second blocking portion 121 is arranged on the same layer as the first blocking portion 117 and the pixel definition portion 113, a surface of the interlayer dielectric layer 103 at the transition area 10c is cleaned for several times by etching solutions of patterning processes of other layers before manufacturing the second blocking portion 121, so that the adhesion force of the first blocking portion 117 on the interlayer dielectric layer 103 is reduced. If the second blocking portion 121 is directly manufactured on the interlayer dielectric layer 103 of the transition area 10c, the second blocking portion 121 and the interlayer dielectric layer 103 of the transition area 10c cannot be stably combined, and thus can easily fall off from the interlayer dielectric layer 103 of the transition area 10c. Therefore, in this embodiment, by providing the second protective portion 120, the surface of the interlayer dielectric layer 103 located at the transition area 10c may be protected before the second blocking portion 121 is manufactured, so as to reduce the times that the interlayer dielectric layer 103 is cleaned by the etching solution, improve the adhesion force of the interlayer dielectric layer 103 at the transition area 10c, and ensure the stability of combination of the first packaging dam 1a and the interlayer dielectric layer 103.

In the transition area 10c, since the times that a surface of the interlayer dielectric layer covered with the second protective layer 120 is cleaned by etching are less than the times that a surface of the interlayer dielectric layer uncovered with the second protective layer 120 is cleaned by etching, a surface roughness of the interlayer dielectric layer 103 covered with the second protective layer 120 is greater than a surface roughness of the interlayer dielectric layer 103 uncovered with the second protective layer 120. For example, a ratio between the surface roughness of the interlayer dielectric layer 103 covered with the second protective layer 120 and the surface roughness of the interlayer dielectric layer 103 uncovered with the second protective layer 120 may be 100:5 to 100:95, 100:10 to 100:90, 100:20 to 100:80, 100:30 to 100:70, 100:40 to 100:60, or the like.

As the first blocking portion 117 and the second blocking portion 121 are arranged on the same layer, the manufactured first blocking portion 117 and the manufactured second blocking portion 121 usually have the same thickness. Therefore, in order to make the thickness of the second packaging dam 1b greater than the thickness of the first packaging dam 1a, a solution adopted by this embodiment is: the thickness of the second protective portion 120 is designed to be greater than the thickness of the first protective portion 119, but which is not limited thereto, the thickness of the first protective portion 119 may also be same as that of the second protective portion 120, and then the thickness of the second blocking portion 121 is greater than that of the first blocking portion 117, so that the thickness of the second packaging dam 1b is greater than the thickness of the first packaging dam 1a, depending on the specific circumstances.

In an optional embodiment of the present disclosure, the second protective portion 120 and the first protective portion 119 may be arranged on the same layer, that is, the first protective portion 119 and the second protective portion 120 may be simultaneously formed by one-time patterning process, which can reduce the number of processing steps and the usage of mask plates, thereby reducing costs.

In this embodiment, since the second protective portion 120 and the first protective portion 119 may be arranged on the same layer, the second protective portion 120 is also arranged on the same layer as the first electrode 112 when the first protective portion 119 and the first electrode 112 are arranged on the same layer, that is, the first conductive film covering on the interlayer dielectric layer 103 and located at the display area 10a and the transition area 10c may be patterned by one-time patterning process to simultaneously form the first protective portion 119, the second protective portion 120 and the first electrode 112. When the first protective portion 119 is disposed on the same layer as the planarization portion 116, the second protective portion 120 is also arranged on the same layer as the planarization portion 116, that is, the planarization film covering the interlayer dielectric layer 103 and located at the display area 10a and the transition area 10c may be patterned by one-time patterning process to simultaneously form the first protective portion 119, the second protective portion 120, and the planarization portion 116.

When the first protective portion 119, the second protective portion 120 and the planarization portion 116 are arranged on the same layer, in order to make the thickness of the second protective portion 120 greater than the thickness of the first protective portion 119, a gray-scale mask may be used to pattern the planarization film to form the first protective portion 119 and the second protective portion 120 with different thicknesses. For example, the planarization film may be a photoresist film which may be a positive photoresist or a negative photoresist. The light transmittance of an area corresponding to the formed first protective portion 119 in the gray-scale mask is different from that of an area corresponding to the formed second protective portion 120, so that the thickness of the first protective portion 119 obtained after exposure and development is different from the thickness of the second protective portion 120.

It should be noted that when the photoresist film is a positive photoresist, in order to make the thickness of the second protective portion 120 greater than the thickness of the first protective portion 119, the light transmittance of an area corresponding to the formed first protective portion 119 in the gray-scale mask is greater than that of an area corresponding to the formed second protective portion 120; and when the photoresist film is a negative photoresist, in order to make the thickness of the second protective portion 120 greater than the thickness of the first protective portion 119, the light transmittance of an area corresponding to the formed first protective portion 119 in the gray-scale mask is less than that of the area corresponding to the formed second protective portion 120.

In another optional embodiment of the present disclosure, the second protective portion 120 and the first protective portion 119 are arranged in different layers, that is, each of the first protective portion 119 and the second protective portion 120 is formed by a patterning process. For example, when the first protective portion 119 and the first electrode 112 are arranged on the same layer, the second protective portion 120 may be arranged on the same layer as the planarization portion 116, that is, when the first protective portion 119 and the first electrode 112 are formed by one-time patterning process, the second protective portion 120 and the planarization portion 116 are formed by the patterning process, so that this design may improve the stability of bonding between the first packaging dam 1a and second packaging dam 1b and the interlayer dielectric layer 103d at the transition area 10c, without using additional patterning processes, to reduce the number of processing steps and the usage of mask plates, and thus reduce costs.

Since the thickness of the first electrode 112 is usually smaller than the thickness of the planarization portion 116, the thickness of the first protective portion 119 provided on the same layer as the first electrode 112 may be smaller than the thickness of the second protective portion 120 provided on the same layer as the planarization portion 116, so that this design does not require the additional adjustment of processing parameters, that is, the thickness of the first protective portion 119 is smaller than the thickness of the second protective portion 120.

In addition, since the material of the first protective portion 119 is different from the material of the second protective portion 120 in this embodiment, the bonding force between the first packaging dam 1a and the interlayer dielectric layer 103 at the transition area 10c is different from the bonding force between the second packaging dam 1b and the interlayer dielectric layer 103 at the transition area 10c. This design can prevent the first packaging dam 1a and second packaging dam 1b from falling off the interlayer dielectric layer 103 simultaneously, so as to improve the packaging effect.

It should be noted that that formation manner of the first protective portion 119 and the second protective portion 120 is not limited to the above two cases, the second protective portion 120 may be arranged on the same layer as the first electrode 112 when the first protective portion 119 and the planarization portion 116 are arranged on the same layer. This design can improve the bonding stability between the first packaging dam 1a and second packaging dam 1b and the interlayer dielectric layer 103 at the transition area 10c, without adding additional patterning processes, and thereby reducing the number of processing steps and the usage of mask plates to reduce costs. It should be understood that, in order to make the thickness of the second packaging dam 1b greater than the thickness of the first packaging dam 1a, in this embodiment, the thickness of the first blocking portion 117 may be adjusted to be less than the thickness of the second blocking portion 121 through a gray-scale process.

For example, the first insulating film is patterned by using the gray-scale process to form the pixel definition portion 113, the first blocking portion 117, and the second blocking portion 121. The first insulating film may be a photoresist film which may be a positive photoresist or a negative photoresist. The light transmittance of the area corresponding to the formed first blocking portion 117 in the gray-scale mask is different from that of the area corresponding to the formed second blocking portion 121, so that the blocking portion 117 obtained after exposure and development has a thickness different from the thickness of the second blocking portion 121. When the photoresist film is a positive photoresist, in order to make the thickness of the second blocking portion 121 greater than the thickness of the first blocking portion 117, the light transmittance of an area corresponding to the formed first blocking portion 117 in the gray-scale mask is greater than that of an area corresponding to the formed second blocking portion 121. When the photoresist film is a negative photoresist, in order to make the thickness of the second blocking portion 121 greater than the thickness of the first blocking portion 117, the light transmittance of the area corresponding to the formed first blocking portion 117 in the gray-scale mask is smaller than the light transmittance of the area corresponding to the formed second blocking portion 121.

It should be noted that as for beneficial effects that the second protective portion 120 and the first electrode 112 are provided on the same layer, and beneficial effects that the second protective portion 120 and the planarization portion 116 are provided on the same layer, these beneficial effects can refer to the aforementioned beneficial effects that the first protective portion 119 and the first electrode 112 are provided on the same layer, and the beneficial effects that the second protective portion 120 and the planarization portion 116 are provided on the same layer, which will not be repeated herein.

In some embodiments, the second protective portion 120 and the first protective portion 119 may be disconnected from each other, which can increase the blocking and packaging path, and thus improve the packaging effect.

In some embodiments, when the first protective portion 119 and the second protective portion 120 are arranged on the same layer as the planarization portion 116, if the planarization portion 116 is a two-layer structure including the first planarization film layer 116a and the second planarization film layer 116b, the first protective portion 119 or the second protective portion 120 may also be a two-layer structure. Each of the first protective portion 119 and the second protective portion 120 may include a film layer provided on the same layer as the first planarization film layer 116a and a film layer provided on the same layer as the second planarization film layer 116b, which however is not limited thereto, the second protective portion 120 may also be a two-layer structure, and the first protective portion 119 may be a single-layer structure, that is, the first protective portion may only include a film layer provided on the same layer as the second planarization film layer 116b. It is also possible that each of the first protective portion 119 and the second protective portion 120 may be a single-layer only including a film layer provided on the same layer as the second planarization film layer 116b.

As shown in FIG. 5, at least one of the first packaging dam 1a and the second packaging dam 1b further includes a photo spacer (abbreviated as PS). The photo spacer may be formed at a side of the first blocking portion 117 or the second blocking portion 121 back away from the interlayer dielectric layer 103, which may increase the thickness of the first packaging dam 1a and the second packaging dam 1b. The photo spacer may block the organic packaging film material in the packaging layer 118 from flowing to the opening area 10b, which further improves the restriction against the flow of the organic packaging film material in the packaging layer 118, and further improve the packaging reliability of the display substrate 10.

For example, the aforementioned photo spacer may be provided on the same layer as the supporting portion 132 of the display area 10a. The photo spacer formed on the first blocking portion 117 may be defined as a first photo spacer 122, and the photo spacer formed on the second blocking portion 121 may be defined as a second photo spacer 123. The materials of the first photo spacer 122 and the first blocking portion 117 may be the same, and the first photo spacer 122 and the first blocking portion 117 may be formed by the same patterning process (for example, gray-scale masking process) to improve the structural stability of the respective layers in the first packaging dam 1a; which however is not limited thereto, the materials of the first photo spacer 122 and the first blocking portion 117 may also be different, and the first photo spacer 122 and the first blocking portion 117 may be formed by different patterning processes. Similarly, the materials of the second photo spacer 123 and the second blocking portion 121 may be the same, and the second photo spacer 123 and the second blocking portion 121 may be formed by the same patterning process (for example, gray-scale masking process) to improve the structural stability of the respective layers in the first packaging dam 1a; which however is not limited thereto, and the materials of the second photo spacer 123 and the second blocking portion 121 may also be different, and the second photo spacer 123 and the second blocking portion 121 may be formed by different patterning processes.

It should be noted that the thickness mentioned in the embodiments of the present disclosure refers to a dimension in a Z direction as shown in FIGS. 3 to 6 and FIGS. 9A, 9B, and 10.

Figure 16A:
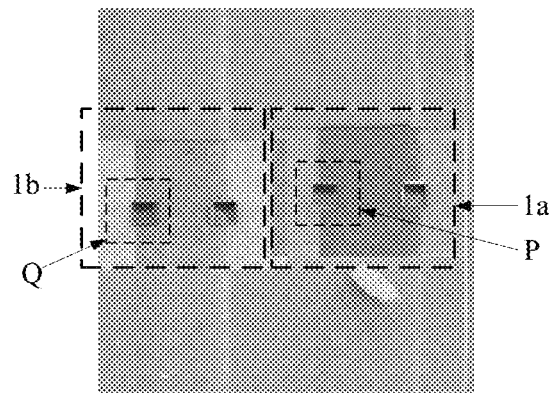
FIG. 16A is a schematic view of a first packaging dam and a second packaging dam in the display substrate provided by some embodiments of the present disclosure under a scanning electron microscope.
Figure 16B:
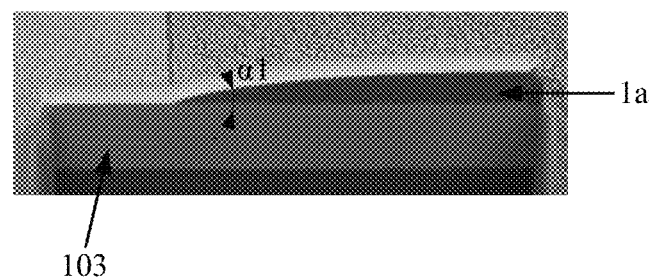
FIG. 16B is a schematic view showing an observation port at P in FIG. 16A under a scanning electron microscope.
Figure 16C:
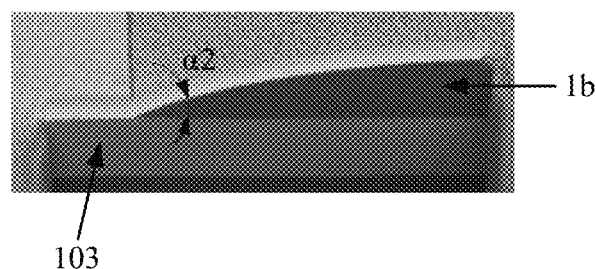
FIG. 16C is a schematic view showing an observation port at Q in FIG. 16A under a scanning electron microscope.

FIG. 16A shows a schematic view of the first packaging dam and second packaging dam under a scanning electron microscope; FIG. 16B shows a schematic view of the observation port at P in FIG. 16A under the scanning electron microscope; FIG. 16C shows a schematic view of the observation port at Q in FIG. 16A under the scanning electron microscope.

As shown in FIG. 16B, an outer contour of the first packaging dam 1a is inclined with respect to the surface of the interlayer dielectric layer 103, and an inclination angle α1 between the outer contour and the interlayer dielectric layer 103 may be 20° to 35°, for example, 20°, 25°, 30°, 35° or the like. For example, the outer contour may be arc-shaped. The thickness of the first packaging dam 1a may be 0.5 μm to 2 μm, for example, 0.5 μm, 1 μm, 1.5 μm, 2 μm, or the like.

As shown in FIG. 16C, the outer contour of the second packaging dam 1b is inclined with respect to the surface of the interlayer dielectric layer 103, and an inclination angle α2 between the outer contour and the interlayer dielectric layer 103 may be 20° to 35°, for example, 20°, 25°, 30°, 35°, or the like. For example, the outer contour may be arc-shaped. The thickness of the second packaging dam 1b may be 0.5 μm to 2 μm, for example, 0.5 μm, 1 μm, 1.5 μm, 2 μm, or the like.

Since the thickness of the second packaging dam 1b is greater than the thickness of the first packaging dam 1a, it can be known that the inclination angle α2 between the second packaging dam 1b and the interlayer dielectric layer 103 is greater than the inclination angle α1 between the first packaging dam 1a and the interlayer dielectric layer 103.

In some embodiments, as shown in FIG. 5, a distance h1 between the first packaging dam 1a and the second packaging dam 1b is smaller, so that a proportion of the transition area 10c in the display substrate can be reduced and a proportion of other areas, for example the display area 10a can be increased, while ensuring the first packaging dam 1a and the second packaging dam 1b can block the organic packaging film material in the packaging layer 118 from flowing to the opening area 10b. A distance h2 between the first packaging dam 1a and the display area 10a is larger, to facilitate designing the inner-ring wiring area 10e, isolation area 10d, or the like. A distance h3 between the second packaging dam 1b and the opening area 10b is larger, to avoid a situation that the second packaging dam 1b is damaged for fallen off due to the temperature too high during the opening area is cut by a laser, so as to improve the packaging stability. Based on this, in some embodiments, as shown in FIG. 5, the distance h1 between the first packaging dam 1a and the second packaging dam 1b may be less than the distance h2 between the first packaging dam 1a and the display area 10a, and/or may be less than the distance h3 between the second packaging dam 1b and the opening area 10b.

Figure 6:
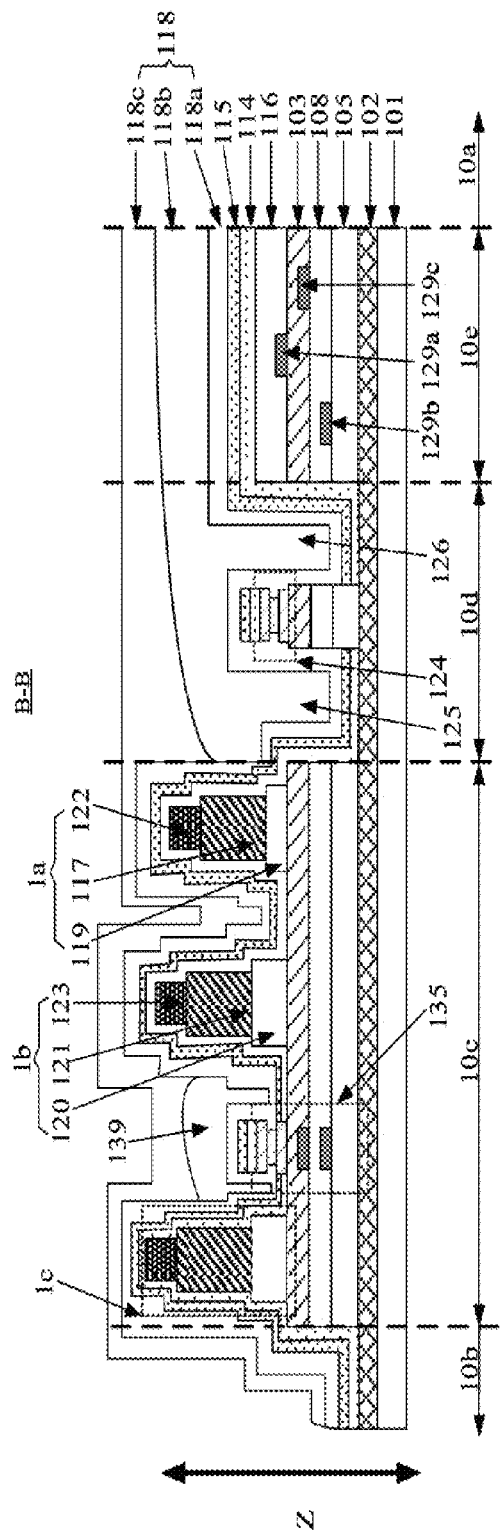
FIG. 6 is a cross-sectional view of the display substrate in the B-B direction of another embodiment shown in FIG. 1.
Figure 7:
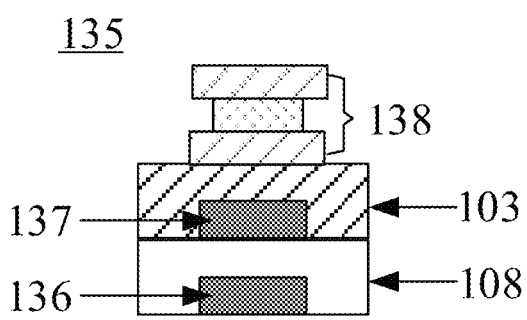
FIG. 7 is a cross-sectional view of the blocking wall in the display substrate shown in FIG. 6.
Figure 17:
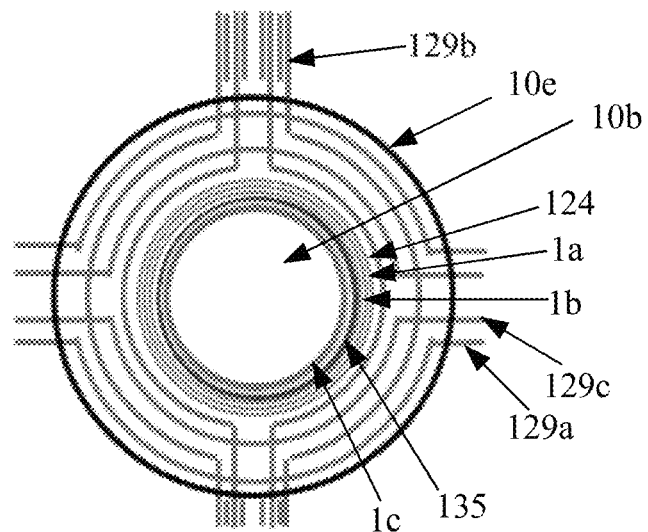
FIG. 17 is a schematic top view of a part of a structure in the display substrate provided by some embodiments of the present disclosure.

In some embodiments, as shown in FIGS. 6, 7 and 17, the transition area 10c may also include a third packaging dam 1c, a blocking wall 135 and an organic insulating packaging portion 139.

The third packaging dam 1c is disposed around the opening area 10a and is located at a side of the second packaging dam 1b adjacent to the opening area 10a; the third packaging dam 1c and the second packaging dam 1b have the same structure and include the same material. Therefore, the third packaging dam 1c and the second packaging dam 1b may have the same material layer and may be formed by the same patterning process.

The blocking wall 135 is located between the second packaging dam 1b and the third packaging dam 1c and disposed around the third packaging dam 1c. For example, the blocking wall 135 may include a first film layer 136 arranged on the same layer as the gate electrode 106 and the first electrode plate 130, a second film layer 137 arranged on the same layer as the second electrode plate 131, a third film layer 138 arranged on the same layer as the source electrode 110 and the drain electrode 111, a second gate insulating layer 108 between the first film layer 136 and the second film layer 137, and an interlayer dielectric layer 103 between the third film layer 138 and the second film layer 137. In other words, the first film layer 136, the gate electrode 106, and the first electrode plate 130 have the same structure and include the same material; the second film layer 137 and the second electrode plate 131 have the same structure and include the same material; the third film layer 138, the source electrode 110 and the drain electrode 111 have the same structure and include the same material. Therefore, the first film layer 136, the gate electrode 106, and the first electrode plate 130 may use the same material layer and may be formed by the same patterning process; the second film layer 137 and the second electrode plate 131 may be the same material layer and may be formed by the same patterning process; the third film layer 138, the source electrode 110 and the drain electrode 111 may use the same material layer and may be formed by the same patterning process.

The organic insulating packaging portion 139 is between the third packaging dam 1c and the second packaging dam 1b and covers the blocking wall 135. The organic insulating packaging portion 139 has the same material as the organic packaging film layer 118b of the packaging layer 118. For example, it may be formed by the same inkjet printing process.

In this embodiment, the third packaging dam 1c, the blocking wall 135, and the organic insulating packaging portion 139 are provided for a further blocking effect, so that the transition area 10c can fully isolate the opening area 10b from the display area 10a, prevent impurities such as moisture and oxygen from entering the display area 10a from the opening area 10b, and prevent cracks caused when the opening area 10b is formed from extending to the display area 10a.

When the transition area 10c includes the third packaging dam 1c, the blocking wall 135 and the organic insulating packaging portion 139, the first inorganic packaging film layer 118a as aforementioned also covers the third packaging dam 1c and the blocking wall 135. The organic packaging film layer 118b and the organic insulating packaging portion 139 are formed by the inkjet printing process. The second inorganic packaging film layer 118c also covers the third packaging dam 1c, the blocking wall 135 and the organic insulating packaging portion 139.

It should be noted, in the embodiments of the present disclosure, as shown in FIG. 1, when the opening area 10b is circular, orthographic projections of the first packaging dam 1a, the second packaging dam 1b, the third packaging dam 1c, and the blocking wall 135 on the base substrate may also be circular rings; and when the opening area 10b is rectangular, the orthographic projections of the first packaging dam 1a, the second packaging dam 1b, the third packaging dam 1c, and the blocking wall 135 on the base substrate may also be rectangular rings, which however is not limited thereto, the opening area 10b may also be in other regular or irregular shapes, to which the first packaging dam 1a, the second packaging dam 1b, the third packaging dam 1c, and the blocking wall 135 may be adapted.

Figure 8:
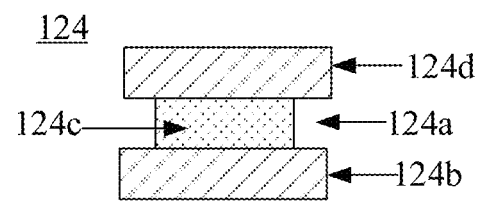
FIG. 8 is a cross-sectional view of the isolation column in the isolation area of the display substrate in an embodiment of the present disclosure.

In some embodiments, as shown in FIGS. 5, 6, and 8, the display substrate 10 further includes an isolation column 124 in the isolation area 10d. The isolation column 124 is formed at a side of the interlayer dielectric layer 103 back away from the base substrate and disposed around the first packaging dam 1a, and is provided with a groove 124a at the sidewall thereof, so that when the light-emitting material or the cathode material is evaporated, the light-emitting material layer 114 and the cathode (i.e., the second electrode 115) are disconnected at the groove 124a, which can block a path along which the moisture and oxygen of the opening area 10b corrode towards the display area 10a, to further preventing the light-emitting portion 114a of the display area 10a from being corroded, and improve the display effect of the display substrate 10 and prolong the service life of a product.

It should be noted that the number of isolation column 124 is not limited to one, but can also be in plural.

In some embodiments, the isolation column 124 may be arranged on the same layer as the source electrode 110 and the drain electrode 111 of the thin film transistor, that is, the isolation column 124, the source electrode 110 and the drain electrode 111 are formed by the same patterning process, which can also reduce the number of processing steps and the usage of mask plates, and thus can reduce costs. In addition, it should be understood that the isolation column 124 may be disconnected with the source electrode 110 and the drain electrode 111 of the thin film transistor to avoid the isolation column 124 from being powered on during displaying.

Since the isolation column 124 as aforementioned may be arranged on the same layer as the source electrode 110 and the drain electrode 111 of the thin film transistor in the display area, the structure and material of the isolation column 124 may be the same as the structure and material of the source electrode 110 and the drain electrode 111. For example, when each of the source electrode 110 and the drain electrode 111 is of a three-layer metal structure, the isolation column 124 may also be of a three-layer metal structure. Specifically, as shown in FIG. 8, the isolation column 124 may include a first metal layer 124b, a second metal layer 124c, and a third metal layer 124d that are sequentially laminated on the interlayer dielectric layer 103. An outer boundary of the orthographic projection of the second metal layer 124c on the interlayer dielectric layer 103 is inside an outer boundary of the orthographic projections of the first metal layer 124b and the third metal layer 124d on the interlayer dielectric layer 103 to form a groove 124a at the sidewall of the isolation column 124, so that a longitudinal section of the isolation column 124 is formed as an "I-shaped" structure.

The first metal layer 124b and the third metal layer 124d may be titanium layers, that is, the first metal layer 124b and the third metal layer 124d may be made of titanium (Ti) materials, and the second metal layer 124c may be an aluminum layer, that is, the second metal layer 124c may be made of an aluminum (Al) material to ensure that the first metal layer 124b and the third metal layer 124d are not be affected by etching when a side etching of the second metal layer 124c is performed, which however is not limited thereto, the first metal layer 124b, the second metal layer 124c, and the third metal layer 124d may also be made of other materials, for example, the metal materials such as molybdenum, aluminum, or alloy materials, as long as the above technical effects can be achieved, and the present disclosure is not limited thereto.

In some embodiments, as shown in FIGS. 5 and 6, the drive circuit layer has a first slot 125 and a second slot 126 located in the isolation area 10d. The first slot 125 is located at a side of the isolation column 124 adjacent to the first packaging dam 1a, and is disposed around the first packaging dam 1a; and the second slot 126 is located at a side of the isolation column 124 adjacent to the display area 10a, and is disposed around the first slot 125. This design can increase the probability that the light-emitting material is disconnected at the side surface of the isolation column 124.

The first slot 125 and the second slot 126 may penetrate through a part of the drive circuit layer, and the first slot 125 and the second slot 126 are formed at a side of the drive circuit layer far away from the base substrate. In addition, the first slot 125 and the second slot 126 may also penetrate through the entire drive circuit layer, that is, the slot may be extended to the buffer layer 102.

As shown, the first slot 125 and the second slot 126 may penetrate through the entire drive circuit layer to further increase the probability that the light-emitting material or cathode material is disconnected at the side surface of the isolation column 124. In addition, the display substrate 10 is flexible and can be bent, which can also alleviate stress exerted on the part of the drive circuit layer at the display area 10a, and ensure the connection reliability of components in the drive circuit layer.

It should be noted that in the embodiment of the present disclosure, when the opening area 10b is circular, the orthographic projections of the first slot 125, the second slot 126, and the isolation column 124 on the base substrate may also be circular rings; and when the opening area 10b is rectangular, the orthographic projections of the first slot 125, the second slot 126, and the isolation column 124 on the base substrate may also be rectangular rings; which is not limited thereto, the opening area 10b may also be in any of other regular or irregular shapes to which and the first slot 125, second slot 126, and isolation column 124 are adapted.

Figure 9A:
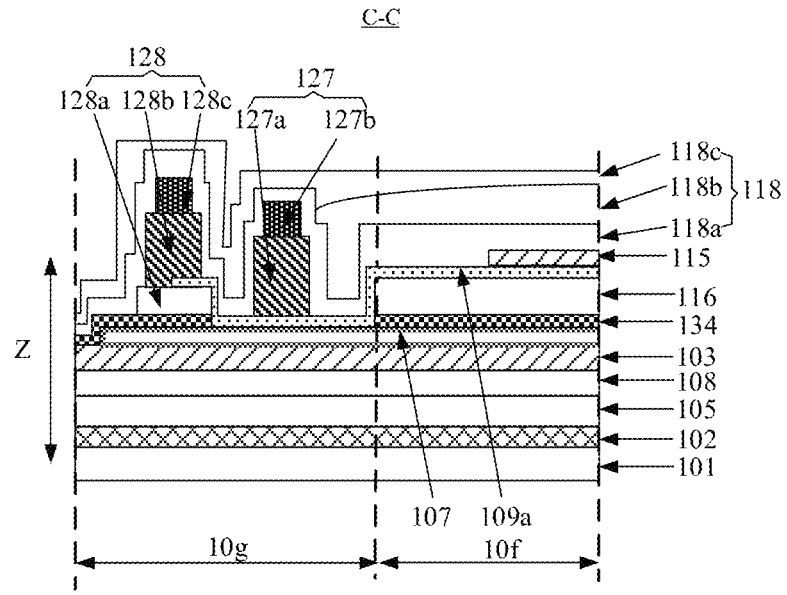
FIGS. 9A and 9B are cross-sectional views of the display substrate in the C-C direction under the different embodiments shown in FIG. 1.

In some embodiments, as shown in FIG. 9A, the peripheral packaging area 10g may also be provided with a first peripheral packaging dam 127 and a second peripheral packaging dam 128. The second peripheral packaging dam 128 is arranged at a side of the first peripheral packaging dam 127 far away from the display area 10a, and the thickness of the second peripheral packaging dam 128 is greater than the thickness of the first peripheral packaging dam 127. The first peripheral packaging dam 127 may include a first peripheral blocking portion 127a and a first peripheral photo spacer 127b that are sequentially formed on the interlayer dielectric layer 103. The second peripheral packaging dam 128 may include a third protective portion 128a, a second peripheral blocking portion 128b, and a second peripheral photo spacer 128c that are sequentially formed on the interlayer dielectric layer 103.

In some embodiments, the third protective portion 128a may be arranged on the same layer as the planarization portion 116 of the display area 10a. The first peripheral blocking portion 127a and the second peripheral blocking portion 128b may be arranged on the same layer as the pixel definition portion 113 of the display area 10a. The first peripheral photo spacer 127b and the second peripheral photo spacer 128c may be arranged on the same layer as the supporting portion of the display area 10a.

It should be noted that the first peripheral packaging dam 127 may also include a protective portion between the interlayer dielectric layer 103 and the first peripheral blocking portion 127a, and arranged on the same layer as the planarization portion 116, depending on the specific requirements.

In some embodiments, a thickness difference between the second peripheral packaging dam 128 and the first peripheral packaging dam 127 is greater than a thickness difference between the second packaging dam 1b and the first packaging dam 1a.

In some embodiments, as shown in FIG. 9A, the drive circuit layer further includes a peripheral wiring 107 and a first peripheral transfer line 109a in the peripheral wiring area 10f. The peripheral wiring 107 may be arranged on the same layer as the source electrode 110 and the drain electrode 111, and the first peripheral transfer line 109a may be arranged on the same layer as the first electrode 112. An end of the peripheral wiring 107 may extend to the peripheral packaging area 10g. The peripheral wiring 107 may be located below the first peripheral packaging dam 127 and the second peripheral packaging dam 128. An end of the first peripheral transfer line 109a may extend to the peripheral packaging area 10g, and is located between the third protective portion 128a and the second peripheral blocking portion 128b in the second peripheral packaging dam 128.

It should be noted that in some embodiments, after the source/drain electrode layer is manufactured and before the planarization layer is manufactured, a passivation film layer 134 may also be manufactured. The passivation film layer 134 after being patterned may not only include a part in the display area 10a, as shown in FIG. 4, but also include parts in the peripheral wiring area 10f and peripheral packaging area 10g, as shown in FIG. 9A. However, it should be understood that, in some embodiments, after the source/drain electrode layer is manufactured, it is also possible to manufacture a planarization layer directly but not manufacture a passivation film layer 134; or after the passivation film layer 134 is patterned, the passivation film layer 134 may include a part in the display area 10a, and the peripheral wiring area 10f and the peripheral packaging area 10g do not have any part of the structure of the passivation film layer 134, depending on the specific requirements.

As shown in FIG. 9A, the first peripheral transfer line 109a may be electrically connected to the peripheral wiring 107 in the peripheral wiring area 10f through a via hole, and specifically, the first peripheral transfer line 109a may be in contact with the peripheral wiring 107 below the first peripheral packaging dam 127 to achieve electrical connection, which is not limited thereto, and the first peripheral transfer line 109a may also be electrically connected to the second electrode 115 in the peripheral wiring area 10f. The peripheral wiring 107 may be a VSS power line, or the like, which is not limited thereto.

Figure 9B:
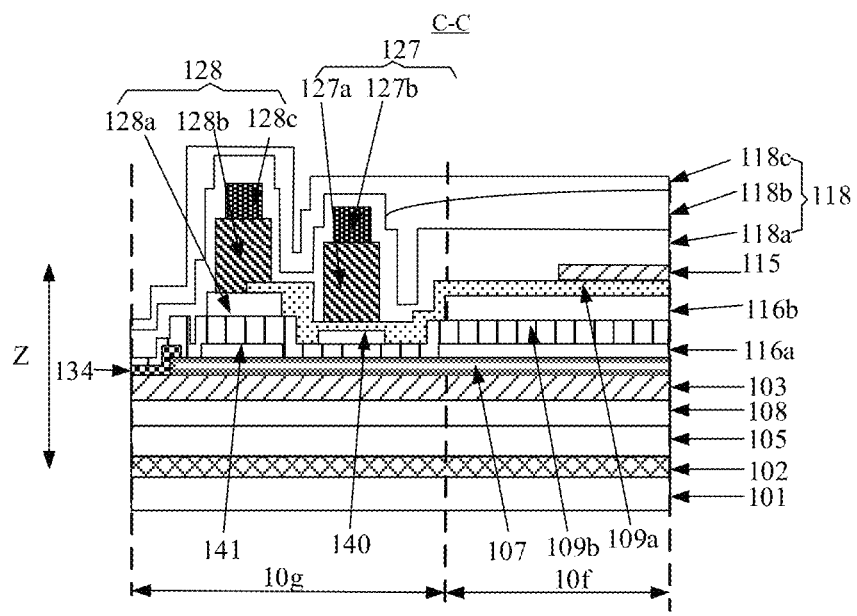

In some embodiments, as shown in FIG. 9B, the drive circuit layer further includes a peripheral wiring 107, a first peripheral transfer line 109a, and a second peripheral transfer line 109b located in the peripheral wiring area 10f. The peripheral wiring 107 may be arranged on the same layer as the source electrode 110 and the drain electrode 111, the first peripheral transfer line 109a may be arranged on the same layer as the first electrode 112, and the second peripheral transfer line 109b may be arranged on the same layer as the transfer electrode 133 of the display area 10a. An end of the peripheral wiring 107 may extend to the peripheral packaging area 10g, and the peripheral wiring 107 may be located below the first peripheral packaging dam 127 and the second peripheral packaging dam 128. An end of the first peripheral transfer line 109a may extend to the peripheral packaging area 10g, and is located between the third protective portion 128a and the second peripheral blocking portion 128b in the second peripheral packaging dam 128. An end of the second peripheral transfer line 109b may extend to the peripheral packaging area 10g, and the second peripheral transfer line 109b may be located below the first peripheral packaging dam 127 and second peripheral packaging dam 128.

In addition, as shown in FIG. 9B, since the peripheral wiring area 10f and the peripheral packaging area 109g in the embodiment of the present disclosure are provided with a second peripheral transfer line 109b arranged on the same layer as the transfer electrode 133, the planarization layer of the embodiment of the present disclosure may be provided with two layers, that is, the first planarization layer and the second planarization layer. The first planarization layer is manufactured before manufacturing the second peripheral transfer line 109b and the transfer electrode 133, wherein the first planarization layer may be patterned to form a first planarization film layer 116a located in the display area 10a and the peripheral wiring area 10f (shown in FIG. 4) and a second pattern block 141 located in the peripheral packaging area 10g (shown in FIG. 9A). The second pattern block 141 is located below the second peripheral packaging dam 128, to raise the second peripheral packaging dam 128. The second planarization layer is manufactured after manufacturing the second peripheral transfer line 109b and the transfer electrode 133, wherein the second planarization layer may be patterned to form a second planarization film layer 116b (shown in FIG. 4) located in the display area 10a and the peripheral wiring area 10f, and a first pattern block 140 and a third protective portion 128a located in the peripheral packaging area 10g (shown in FIG. 9B). The first pattern block 140 is located below the first peripheral packaging dam 127 to raise the first peripheral packaging dam 127.

It should be noted that in some embodiments, after the source drain electrode layer is manufactured and before the planarization layer is manufactured, a passivation film layer 134 may also be manufactured. The passivation film layer 134 after being patterned may not only include a part located in the display area 10a, as shown in FIG. 4, but also a part located in the peripheral packaging area 10g, as shown in FIG. 9B.

It should be understood that, in some embodiments, after the source/drain electrode layer is manufactured, the planarization layer may also be directly manufactured and the passivation film layer 134 may not be manufactured; or after the passivation film layer 134 is patterned, the passivation film layer 134 may include a part located in the display area 10a, and the peripheral packaging area 10g does not have a part of the structure of the passivation film layer 134, depending on the specific requirements. In some embodiments, the planarization layer may also be a single-layer structure; or after patterning process of a double-layer planarization layer, the planarization layer may include the first planarization film layer 116a and the second planarization film layer 116b located in the display area 10a, and the peripheral packaging area 10g and the peripheral wiring area 10f may only have a structure formed after the first planarization layer is patterned, without a structure formed by patterning the second planarization layer, or the like, depending on specific requirements.

As shown in FIG. 9B, the second peripheral transfer line 109b may be electrically connected to the peripheral wiring 107 in the peripheral wiring area 10f through a via hole, and specifically, the second peripheral transfer line 109b may be in contact with the peripheral wiring 107 below the first peripheral packaging dam 127 and at a side of the second peripheral packaging dam 128 far away from the first peripheral packaging dam 127 to achieve electrical connection, which however is not limited thereto. The first peripheral transfer line 109a may be electrically connected to the second peripheral transfer line 109b in the peripheral wiring area 10f through a via hole, and specifically, the first peripheral transfer line 109a may be in contact with the second peripheral transfer line 109b below the first peripheral packaging dam 127 to achieve electrical connection, which however is not limited thereto. The first peripheral transfer line 109a may also be electrically connected to the second electrode 115 located in the peripheral wiring area 10f. This peripheral wiring 107 may be a VSS power line, or the like, which however is not limited thereto.

In some embodiments, the peripheral wiring area 10f may not only include the peripheral wiring 107, the first peripheral transfer line 109a, and the second peripheral transfer line 109b, but also other wirings (not shown). It should be understood that other wirings may not only include wirings arranged on the same layer as the source electrode 110 and the drain electrode 111 and arranged on the same layer as the first electrode 112, but also may also include wirings arranged on the same layer as the first electrode plate 130, the second electrode plate 131 or the transfer electrode 133.

In some embodiments, as shown in FIG. 5 and FIG. 6, the drive circuit layer further includes an inner-ring signal line in the inner-ring wiring area 10e, and the inner-ring signal line may be electrically connected to the signal wiring of the display area. For example, there may be several inner-ring signal lines, including at least the first inner-ring signal line 129a arranged on the same layer as the source electrode 110/drain electrode 111 of the thin film transistor, a second inner-ring signal line 129b arranged on the same layer as the gate electrode 106/first electrode plate 130 of the thin film transistor, and a third inner-ring signal line 129c arranged on the same layer as the second electrode plate 131.

It should be understood that the first inner-ring signal line 129a, the second inner-ring signal line 129b, and the third inner-ring signal line 129c can be provided to be in plural.

In some embodiments, the first inner-ring signal line 129a may include a data signal line, which however is not limited thereto, and may also include other signal lines as long as the signal lines of the conductive layer may be arranged as required. The second inner-ring signal line 129b may include a gate signal line, which however is not limited thereto, and may also include other signal lines as long as the signal lines of the conductive layer may be arranged as required. The third inner-ring signal line 129c may include a reset signal line and an initialization line, which however is not limited thereto, and may also include other signal lines as long as the signal lines of the conductive layer may be arranged as required.

In some embodiments, the first inner-ring signal line 129a may include a gate signal line, which however is not limited thereto, and may also include other signal lines, such as reset signal lines and initialization lines as long as the signal lines of the conductive layer may be arranged as required. The second inner-ring signal line 129b may be a data signal line, which however is not limited thereto, and may also include other signal lines as long as the signal lines of the conductive layer may be arranged as required. The third inner-ring signal line 129c may include a data signal line, which however is not limited thereto, and may also include other signal lines as long as the signal lines of the conductive layer may be arranged as required.

It should be noted that the opening area 10b in the display substrate 10 of the embodiment of the present disclosure after an opening processing is used to assemble a camera, a sensor, a HOME button, an earpiece, or a speaker. It should be noted that, in the display substrate 10 of the embodiment of the present disclosure, as shown in FIG. 5 and FIG. 6, the opening area 10b may have not been subjected to opening processing, and the opening processing may be performed before assembling the camera and other parts. In addition, in the display substrate 10 of the embodiment of the present disclosure, as shown in FIG. 10, the opening area 10b may have been subjected to opening processing, in this case, the display substrate 10 may be directly used for subsequent assembly.

In addition, it should be noted that after the display area 10a of the display substrate 10 of the present disclosure is subjected to opening processing, the obtained openings include but not limited to the following forms: through holes, grooves, apertures, or the like.

Figure 10:
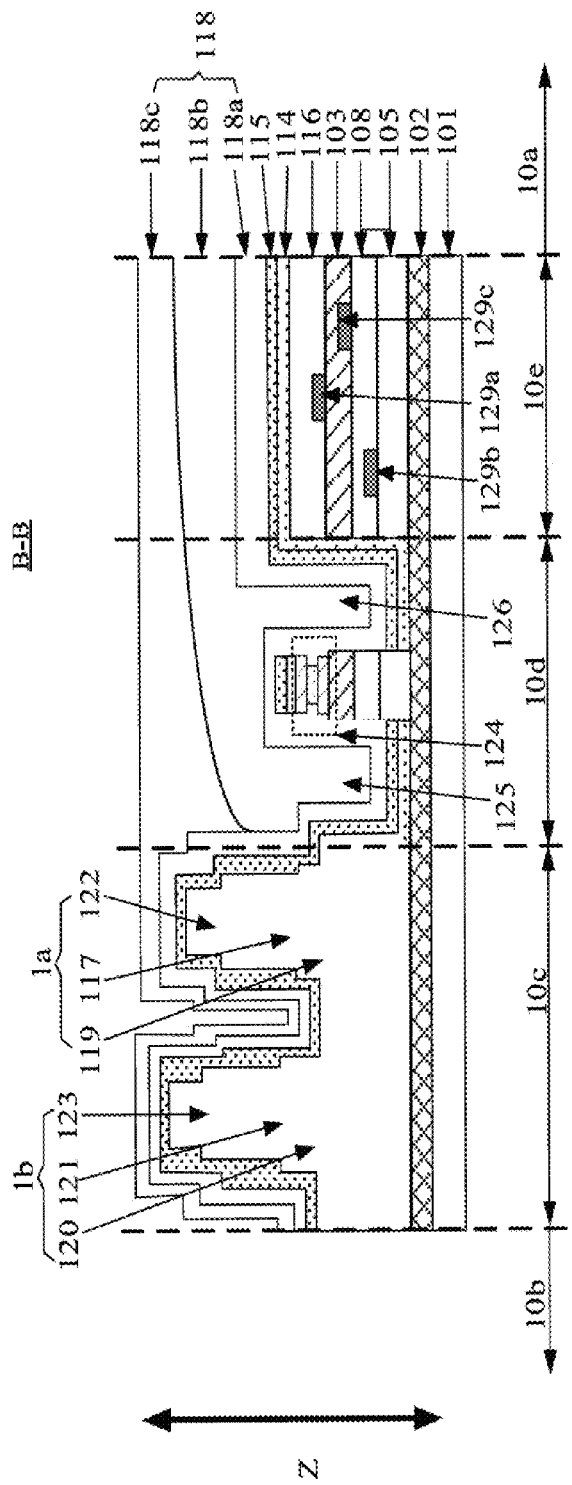
FIG. 10 is a cross-sectional view in the B-B direction of the display substrate of another embodiment the shown in FIG. 1.
Figure 11:
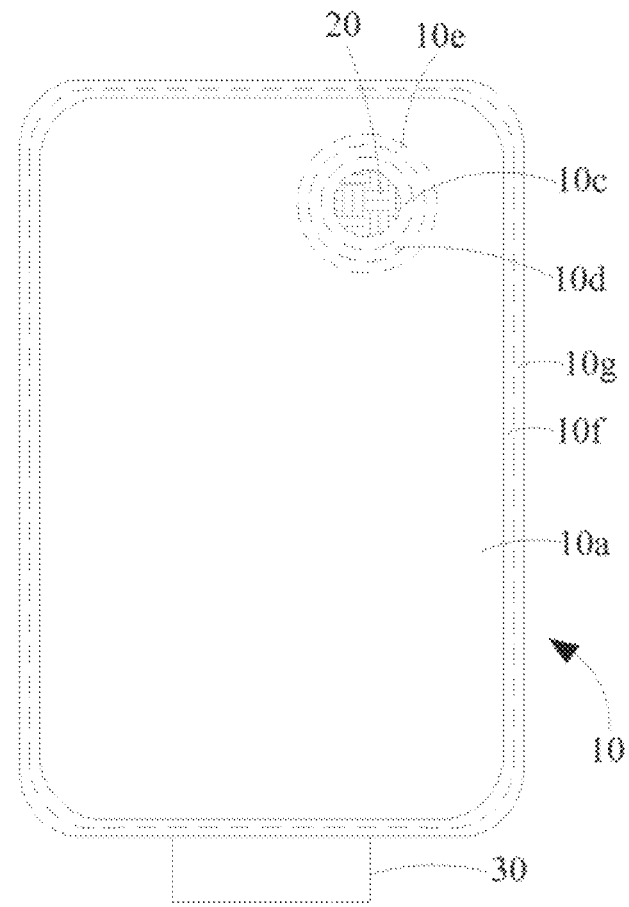
FIG. 11 is a schematic plan view of the display device in an embodiment of the present disclosure.

An embodiment of the present disclosure also provides a display device, which may include the display substrate 10 described in the foregoing embodiments, and may perform opening processing on the opening area 10b of the display substrate 10 to form openings, as shown in FIG. 10. As shown in FIG. 11, the display device further includes functional elements 20 such as a camera, a sensor, a HOME button, an earpiece or a speaker installed in the opening.

According to the embodiment of the present application, the specific type of the display device is not particularly limited, and any types of display devices, such as OLED (Organic Light-Emitting Diode) display screens, mobile devices such as mobile phones, wearable devices such as watches, VR devices, or the like always used in the field can be available, which can be selected by those skilled in the art according to the specific use of the display device, and will not be repeated herein.

It should be noted that as shown in FIG. 11, the display device, in addition to the display substrate 10 and a camera, a sensor, a HOME button, an earpiece or a speaker and other devices, further includes other necessary parts and components. As an example of a display, specifically for example a housing, a power cord, a drive chip 30, or the like, those skilled in the art can accordingly make supplement according to the specific requirements of use of the display device, which will not be repeated herein.

Figure 12:
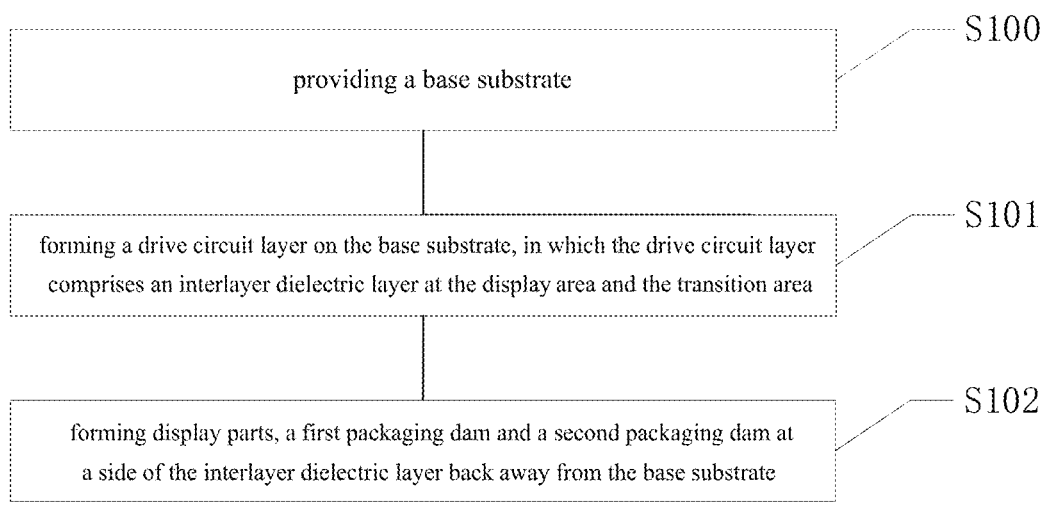
FIG. 12 is a flowchart of the manufacturing method of the display substrate in an embodiment of the present disclosure.

An embodiment of the present disclosure provides a manufacturing method of a display substrate. A structure of the display substrate may refer to the structure of the display substrate 10 described in the foregoing embodiments, which is not described herein; wherein as shown in FIG. 12, the manufacturing method may include:

step S100, providing a base substrate;

step S101, forming a drive circuit layer on a base substrate, the drive circuit layer including an interlayer dielectric layer in a display area and a transition area;

step S102, forming display parts, a first packaging dam, and a second packaging dam at a side of the interlayer dielectric layer back away from the base substrate; wherein the display parts are located in the display area, and include a first electrode and a pixel definition portion that are sequentially formed on the interlayer dielectric layer; the first packaging dam is located at the transition area and disposed around the opening area, and the first packaging dam includes a first protective portion and a first blocking portion that are sequentially laminated on the interlayer dielectric layer; the second packaging dam is located at the transition area and located around the opening area, and the second packaging dam is located at a side of the first packaging dam far away from the display area, and a thickness of the second packaging dam is greater than a thickness of the first packaging dam, the second packaging dam includes a second protective portion and a second blocking portion that are sequentially laminated on the interlayer dielectric layer;

the first blocking portion, the second blocking portion and the pixel definition portion disconnected from each other are formed by using the same patterning process;
a distance between the first packaging dam and the second packaging dam is smaller than a distance between the first packaging dam and the display area.

It should be understood that the above-mentioned manufacturing method provided by the embodiment of the present disclosure has the same characteristics and advantages as the display substrate 10 provided by the embodiment of the present disclosure. Therefore, the characteristics and advantages of the above-mentioned manufacturing method provided by the embodiment of the present disclosure can refer to the characteristics and advantages of the display substrate 10 described above, which will not be repeated herein.

In some embodiments, the first protective portion and the first electrode are disconnected from each other and are formed by using the same patterning process.

In some embodiments, the first protective portion and the planarization portion are disconnected from each other and are formed by using the same patterning process, and the planarization portion is located in the display area and formed between the interlayer dielectric layer and the first electrode.

In some embodiments, the second protective portion and the first protective portion are disconnected from each other and are formed by using the same patterning process.

In some embodiments, the second protective portion and the planarization portion are disconnected from each other and are formed by using the same patterning process; and the planarization portion is located in the display area and formed between the interlayer dielectric layer and the first electrode.

In some embodiments, an isolation column in the isolation area is formed at a side of the interlayer dielectric layer back away from the base substrate. The isolation column is disposed around the transition area, and is provided with a groove at a sidewall thereof.

In some embodiments, the drive circuit layer includes a thin film transistor in the display area, and the thin film transistor includes a source electrode and a drain electrode.

The source electrode, the drain electrode and the isolation column are disconnected from each other and are formed by using the same patterning process.

In some embodiments, the display substrate further includes an inner-ring wiring area between the isolation area and the display area, and the inner-ring wiring area is disposed around the isolation area. The drive circuit layer further includes an inner-ring signal line in the inner-ring wiring area, and the inner-ring signal line is electrically connected to the signal wiring of the display area.

In some embodiments, after forming the display parts, the first packaging dam, and the second packaging dam at the side of the interlayer dielectric layer back away from the base substrate, the manufacturing method further includes:
forming a packaging layer that includes a first inorganic packaging film layer, an organic packaging film layer, and a second inorganic packaging film layer sequentially laminated;
packaging the first packaging dam, the second packaging dam and the display parts by the first inorganic packaging film layer and the second inorganic packaging film layer;
packaging the display parts by the organic packaging film layer and interrupting the organic packaging film layer at a side of the first packaging dam close to the display area.

It should be noted that the specific details of the layers in the display substrate 10 have been described in detail in the corresponding embodiments. The details that are not described in the embodiments concerning the method can refer to the relevant description in the above embodiments of the display substrate 10, which will not be repeated herein.

It should be noted that although the various steps of the method of the present disclosure are described in a particular order in the figures, it is not required or implied that the steps must be performed in the particular order, or all the illustrated steps must be performed to achieve the desired result. Additionally or alternatively, some steps may be omitted, or multiple steps may be combined into one step to be performed, and/or one step is decomposed into multiple steps to be performed. In addition, some of the above steps can be performed in parallel or sequentially, or in other forms, and not limited to the specific performing sequence described above.

Hereinafter, the display area 10a of the display substrate 10 and the manufacturing method thereof will be introduced in combination with the pixel circuit and layout of the display area 10a of the display substrate 10.

Figure 13:
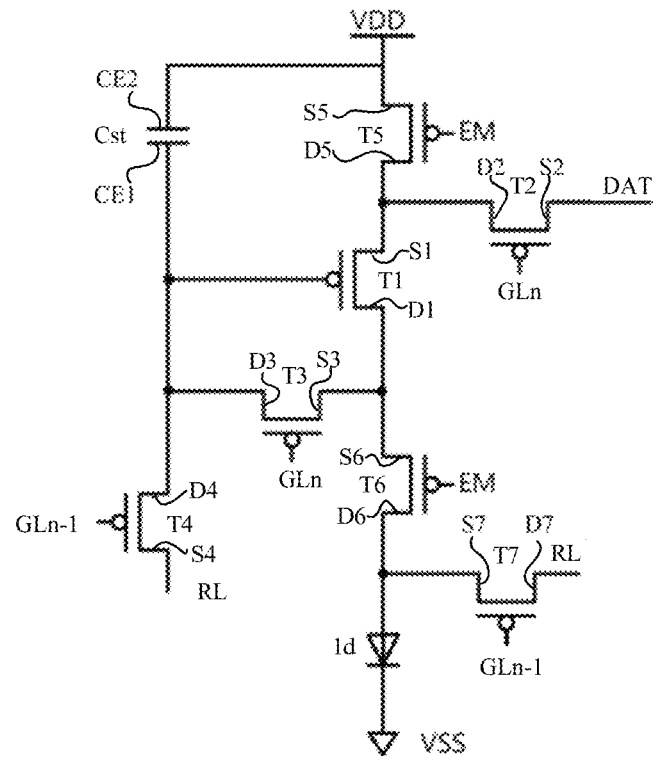
FIG. 13 is an equivalent circuit diagram of the pixel circuit of the display area in the display substrate provided by at least one embodiment of the present disclosure.
Figure 14A:
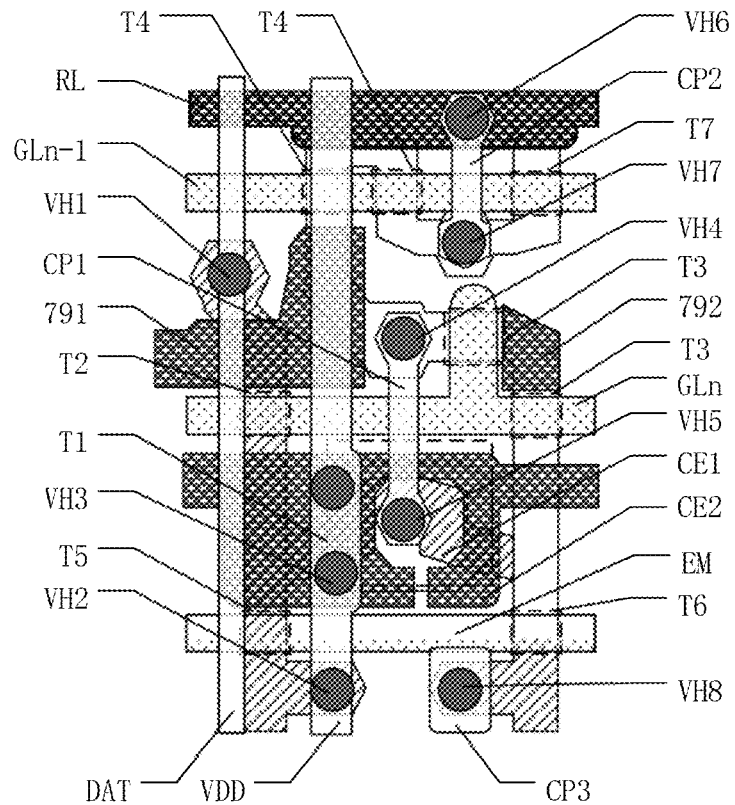
FIGS. 14A-14E are layout designs of various layers of the pixel circuit of the display area in the display substrate provided by some embodiments of the present disclosure.

FIG. 13 is an equivalent circuit diagram of a pixel circuit of a display area in a display substrate provided by at least one embodiment of the present disclosure, and FIGS. 14A-10E are layouts of layers of the pixel circuit of the display area in the display substrate provided by some embodiments of the present disclosure.

FIG. 13 is an equivalent circuit diagram of a pixel circuit in a display substrate provided by at least one embodiment of the present disclosure, and FIGS. 14A-10E are schematic views of layers of the pixel circuit in the display substrate provided by some embodiments of the present disclosure.

In some embodiments, as shown in FIG. 13, the pixel circuit of the drive circuit layer in the display area includes a plurality of thin film transistors T1, T2, T3, T4, T5, T6, and T7, a plurality of signal lines connected to a plurality of the thin film transistors T1, T2, T3, T4, T5, T6 and T7, and a storage capacitor Cst. The plurality of signal lines include a gate line GL (i.e., a scanning signal line), a light-emitting control line EM, an initialization line RL, a data line DAT and a first power line VDD. The gate line GL may include a first gate line GLn and a second gate line GLn−1. For example, the first gate line GLn may be used to transmit a gate scanning signal, and the second gate line GLn−1 may be used to transmit a reset signal. The light-emitting control line EM can be used to transmit light-emitting control signals. Therefore, the pixel circuit is a 7T1C pixel circuit.

It should be noted that the embodiments of the present disclosure include but are not limited thereto, the pixel circuit may also adopt other types of circuit structures, such as a 7T2C structure or a 9T2C structure, which is not limited by the embodiments of the present disclosure.

For example, the first gate line GLn of the pixel circuit corresponding to each row of light-emitting sub-pixels 1d in the display area 10a located on the left and right sides of the opening area 10b can be electrically connected through the inner-ring gate signal line to transmit the gate scanning signal, so as to achieve the compensation effect of the gate scanning signal.

For example, as shown in FIG. 13, the first gate electrode G1 of the first thin film transistor T1 is electrically connected to the third drain electrode D3 of the third thin film transistor T3 and the fourth drain electrode D4 of the fourth thin film transistor T4. The source electrode S1 of the first thin film transistor T1 is electrically connected to the second drain electrode D2 of the second thin film transistor T2 and the fifth drain electrode D5 of the fifth thin film transistor T5. The first drain electrode D1 of the first thin film transistor T1 is electrically connected to the third source electrode S3 of the third thin film transistor T3 and the sixth source electrode S6 of the sixth thin film transistor T6.

For example, as shown in FIG. 13, the second gate electrode G2 of the second thin film transistor T2 is configured to be electrically connected to the first gate line GLn to receive a gate scanning signal, the second source electrode S2 of the second thin film transistor T2 is configured to be electrically connected to the data line The DAT to receive a data signal, and the second drain electrode D2 of the second thin film transistor T2 is electrically connected to the first source electrode S1 of the first thin film transistor T1.

For example, as shown in FIG. 13, the third gate electrode G3 of the third thin film transistor T3 is configured to be electrically connected to the first gate line GLn, the third source electrode S3 of the third thin film transistor T3 is electrically connected to the first drain electrode D1 of the first thin film transistor T1, and the third drain electrode D3 of the third thin film transistor T3 is electrically connected to the first gate electrode G1 of the first thin film transistor T1.

For example, as shown in FIG. 13, the fourth gate electrode G4 of the fourth thin film transistor T4 is configured to be electrically connected to the second gate line GLn−1 to receive a reset signal, and the fourth source electrode S4 of the fourth thin film transistor T4 is configured to be electrically connected to the initialization line RL to receive an initialization signal, and the fourth drain electrode D4 of the fourth thin film transistor T4 is electrically connected to the first gate electrode G1 of the first thin film transistor T1.

For example, as shown in FIG. 13, the fifth gate electrode G5 of the fifth thin film transistor T5 is configured to be electrically connected to the light-emitting control line EM to receive a light-emitting control signal, the fifth source electrode S5 of the fifth thin film transistor T5 is configured to be electrically connected to the first power line VDD to receive a first power signal, and the fifth drain electrode D5 of the fifth thin film transistor T5 is electrically connected to the first source electrode S1 of the first thin film transistor T1.

For example, as shown in FIG. 13, the sixth gate electrode G6 of the sixth thin film transistor T6 is configured to be electrically connected to the light-emitting control line EM to receive a light-emitting control signal, the sixth source electrode S6 of the sixth thin film transistor T6 is electrically connected to the first drain electrode D1 of the first thin film transistor T1, and the sixth drain electrode D6 of the sixth thin film transistor T6 is electrically connected to the first display electrode (for example, the first electrode 112) of the light-emitting sub-pixel 1d.

For example, as shown in FIG. 13, the seventh gate electrode G7 of the seventh thin film transistor T7 is configured to be electrically connected to the second gate line GLn−1 to receive a reset signal, the seventh source electrode S7 of the seventh thin film transistor T7 is electrically connected to the first display electrode (for example, the first electrode 112) of the light-emitting sub-pixel 1d, and the seventh drain electrode D7 of the seventh thin film transistor T7 is configured to be electrically connected to the initialization line RL to receive an initialization signal. For example, the seventh drain electrode D7 of the seventh thin film transistor T7 may be electrically connected to the initialization line RL by connecting to the fourth source electrode S4 of the fourth thin film transistor T4.

For example, as shown in FIG. 13, the storage capacitor Cst includes a first capacitor electrode CE1 (i.e., the first electrode plate 130) and a second capacitor electrode CE2 (i.e., the second electrode plate 131). The second capacitor electrode CE2 is electrically connected to the first power line VDD, the first capacitor electrode CE1 is electrically connected to the first gate electrode G1 of the first thin film transistor T1 and the third drain electrode D3 of the third thin film transistor T3.

For example, as shown in FIG. 13, the second display electrode (for example, the second electrode 115) of the light-emitting sub-pixel 1d is electrically connected to the second power line VSS.

It should be noted that one of the first power line VDD and the second power line VSS is a power line providing a high voltage, and the other thereof is a power line providing a low voltage. In the embodiment shown in FIG. 13, the first power line VDD provides a constant first voltage that is a positive voltage; while the second power line VSS provides a constant second voltage that is a negative voltage, etc. For example, in some examples, the second voltage may be a ground voltage.

It should be noted that the reset signal and the initialization signal as above mentioned can be the same signal.

It should be noted that according to the characteristics of transistors, the transistors may be divided into N-type transistors and P-type transistors. For sake of clarity, the embodiment of the present disclosure takes a transistor as a P-type transistor (for example, a P-type TFT) as an example to elaborate the technical solution of the present disclosure, that is, in the description of the present disclosure, the first thin film transistor T1, the second thin film transistor T2, the third thin film transistor T3, the fourth thin film transistor T4, the fifth thin film transistor T5, the sixth thin film transistor T6, and the seventh thin film transistor T7 may all be of the P-type transistors. However, the transistors of the embodiments of the present disclosure are not limited to the P-type transistors, and those skilled in the art can also use the N-type transistors (for example, N-type TFTs) according to actual requirements, to realize functions of one or more transistors in the embodiments of the present disclosure.

It should be noted that the transistors used in the embodiments of the present disclosure may be thin film transistors, or field effect transistors, or other switching devices with the same characteristics. The thin film transistors may include oxide semiconductor thin film transistors, amorphous silicon thin film transistors, or polysilicon thin film transistors, and the like. The source electrode and the drain electrode of the transistor may be symmetrical in structure, so the source electrode and the drain electrode may not be distinctive in physical structure. In the embodiments of the present disclosure, source/drain electrodes of all or a part of the transistors are exchanged changeable as desired.

In some embodiments, as shown in FIG. 14A, the pixel circuit includes the aforementioned thin film transistors T1, T2, T3, T4, T5, T6, and T7, a storage capacitor Cst, and a first gate line GLn, a second gate line GLn−1, a light-emitting control line EM, an initialization line RL, a data line DAT and a first power line VDD connected to the plurality of thin film transistors T1, T2, T3, T4, T5, T6 and T7. Next, the structure of the pixel circuit will be explained in combination with FIG. 13 and FIGS. 14A-10E.

For example, FIG. 14A is a schematic view of the lamination positional relationship of the semiconductor layer, the first conductive layer, the second conductive layer, and the third conductive layer of the pixel circuit.

Figure 14B:
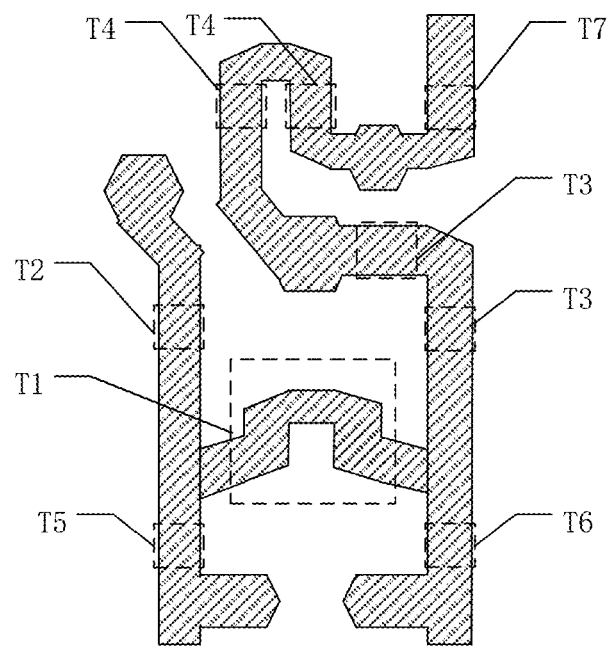

FIG. 14B shows the semiconductor layer of the pixel circuit. For example, the semiconductor layer shown in FIG. 14B includes the active layer 104 shown in FIGS. 3 and 4, which is for example, the active layer 104 of the sixth thin film transistor T6. As shown in FIG. 14B, the semiconductor layer may be formed by a patterning process using a semiconductor material layer. The semiconductor layer may be used to manufacturing active layers of the above-mentioned first thin film transistor T1, the second thin film transistor T2, the third thin film transistor T3, the fourth thin film transistor T4, and the fifth thin film transistor T5, the sixth thin film transistor T6, and the seventh thin film transistor T7, each of the active layers may include a source electrode area, a drain electrode area, and a channel area between the source electrode area and the drain electrode area. For example, the semiconductor layer may be made of amorphous silicon, polysilicon, oxide semiconductor materials, or the like. It should be noted that the above-mentioned source electrode area and drain electrode area may be areas doped with n-type impurities or p-type impurities.

In the display substrate provided by some embodiments of the present disclosure, an insulating layer is formed on the semiconductor layer, and includes the first gate insulating layer 105 shown in FIGS. 3 and 4, but not shown in FIGS. 14A-10E.

Figure 14C:
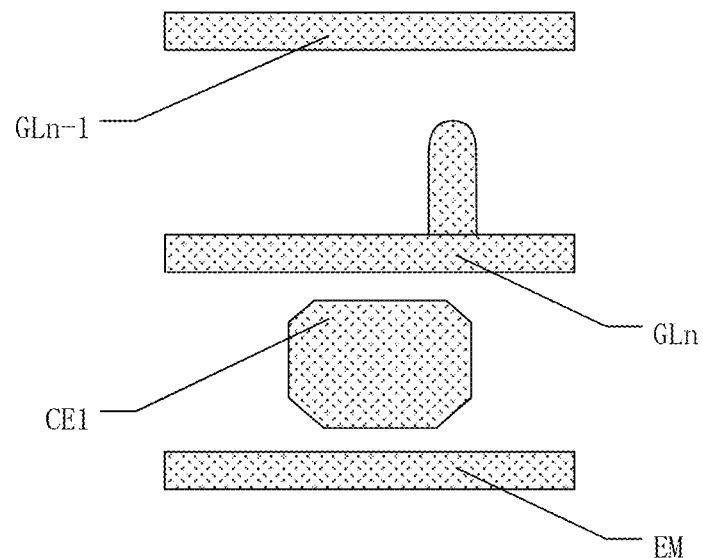

FIG. 14C shows a first conductive layer of the pixel circuit. For example, as shown in FIG. 14C, the first conductive layer of the pixel circuit is disposed on the above-mentioned insulating layer, so as to be insulated from the semiconductor layer shown in FIG. 14B. The first conductive layer may include a first capacitor electrode CE1 (equivalent to the first electrode plate 130) of the storage capacitor Cst, a first gate line GLn, a second gate line GLn−1, a light-emitting control line EM, and gate electrodes of a first thin film transistor T1, a second thin film transistor T2, a third thin film transistor T3, a fourth thin film transistor T4, a fifth thin film transistor T5, a sixth thin film transistor T6, and a seventh thin film transistor T7 (for example, the first gate electrode G1, the second gate electrode G2, the third gate electrode G3, the fourth gate electrode G4, the fifth gate electrode G5, the sixth gate electrode G6, and the seventh gate electrode G7 mentioned above). As shown in FIG. 14C, the gate electrodes of the second thin film transistor T2, the fourth thin film transistor T4, the fifth thin film transistor T5, the sixth thin film transistor T6, and the seventh thin film transistor T7 are parts where the first gate line GLn, the second gate line GLn−1, the light-emitting control line EM overlap the semiconductor layer. The third thin film transistor T3 may be a thin film transistor with a double-gate structure, one of gate electrodes of the third thin film transistor T3 may be a part where the first gate line GLn overlaps the semiconductor layer, and the other gate electrode of the third thin film transistor T3 may be a protrusion protruding from the first gate line GLn. The gate electrode of the first thin film transistor T1 may be the first capacitor electrode CE1. The fourth thin film transistor T4 may be a thin film transistor with a double-gate structure, and two gate electrodes are parts where the second gate line GLn−1 overlaps the semiconductor layer, respectively.

In the display substrate provided by some embodiments of the present disclosure, another insulating layer is formed on the above-mentioned first conductive layer, which includes the second gate insulating layer 108 shown in FIGS. 3 and 4, but not shown in FIGS. 14A-10E.

Figure 14D:
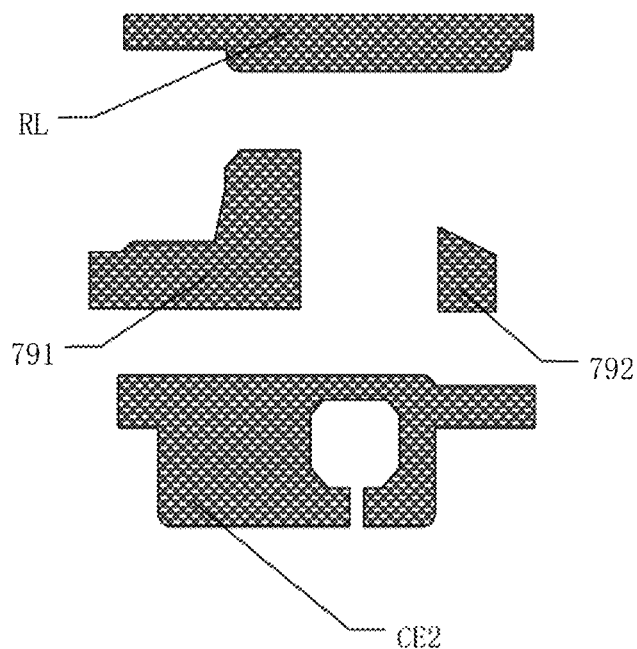

FIG. 14D shows the second conductive layer of the pixel circuit. For example, as shown in FIG. 14D, the second conductive layer of the pixel circuit includes a second capacitor electrode CE2 (i.e., the second electrode plate 131) of the storage capacitor Cst and an initialization line RL. The second capacitor electrode CE2 at least partially overlaps the first capacitor electrode CE1 to form the storage capacitor Cst.

For example, the second capacitor electrode CE2 shown in FIG. 14D has a notch. In some embodiments, the second capacitor electrode CE2 may not have the notch. The embodiment of the present disclosure does not limit the specific structure of the second capacitor electrode CE2.

In some embodiments, the second conductive layer may further include a first light shield portion 791 and a second light shield portion 792. The orthographic projection of the first light shield portion 791 on the base substrate covers the active layer of the second thin film transistor T2 and the active layer between the drain electrode of the third thin film transistor T3 and the drain electrode of the fourth thin film transistor T4, to prevent external light from affecting the active layers of the second thin film transistor T2, the third thin film transistor T3, and the fourth thin film transistor T4. The orthographic projection of the light shield portion 792 on the base substrate covers the active layer between two gate electrodes of the third thin film transistor T3, to prevent external light from affecting the active layer of the third thin film transistor T3. The first light shield portion 791 may be integrally formed with the second light shield portion 792 of the adjacent pixel circuit, and is electrically connected to the first power line VDD through a via hole penetrating through the insulating layer.

In the display substrate provided by some embodiments of the present disclosure, another insulating layer is formed on the above-mentioned second conductive layer, which includes the interlayer dielectric layer 103 shown in FIGS. 3 and 4, but not shown in FIGS. 14A-10E.

Figure 14E:
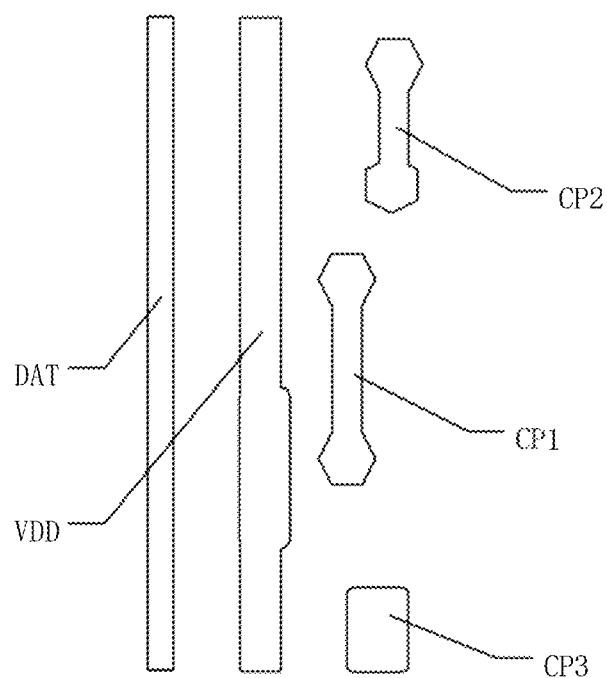

FIG. 14E shows the third conductive layer of the pixel circuit. For example, as shown in FIG. 14E, the third conductive layer of the pixel circuit includes a data line DAT and a first power line VDD. In conjunction with FIGS. 14A and 14E, the data line DAT is connected to the source electrode area of the second thin film transistor T2 in the semiconductor layer through at least one via hole (for example, the via hole VH1) in the first gate insulating layer 105, the second gate insulating layer 108, and the interlayer dielectric layer 103. The first power line VDD is connected to the source electrode area of the semiconductor layer corresponding to the fifth thin film transistor T5 through at least one via hole (for example, the via hole VH2) in the first gate insulating layer, the second gate insulating layer, and the interlayer dielectric layer. The first power line VDD is connected to the second capacitor electrode CE2 in the second conductive layer through at least one via hole in the interlayer dielectric layer (for example, the via hole VH3).

For example, the third conductive layer further includes a first connecting portion CP1, a second connecting portion CP2, and a third connecting portion CP3. The first connecting portion CP1 has one end that is connected to the drain electrode area of the semiconductor layer corresponding to the third thin film transistor T3 through at least one via hole (for example, the via hole VH4) in the first gate insulating layer 105, the second gate insulating layer 108, and the interlayer dielectric layer 103; and the other end that is connected to the gate of the first thin film transistor T1 in the first conductive layer through at least one via hole (for example, the via hole VH5) in the second gate insulating layer 108 and the interlayer dielectric layer 103. The second connecting portion CP2 has one end that is connected to the initialization line RL through a via hole (for example, the via hole VH6) in the interlayer dielectric layer; and the other end that is connected to the source electrode area of the seventh thin film transistor T7 and the source electrode area of the fourth thin film transistor T4 in the semiconductor layer through at least one via hole (for example, the via hole VH7) in the first gate insulating layer 105, the second gate insulating layer 108 and the interlayer dielectric layer 103. The third connection part CP3 is connected to the drain electrode area of the sixth thin film transistor T6 in the semiconductor layer through at least one via hole (for example, the via hole VH8) in the first gate insulating layer 105, the second gate insulating layer 108 and the interlayer dielectric layer 103.

Figure 14F:
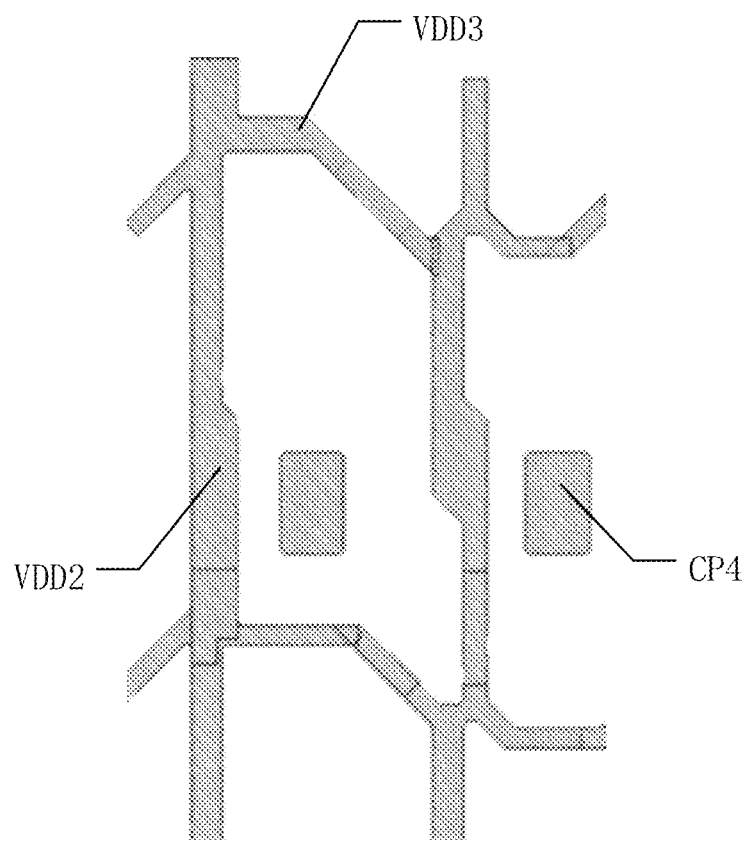
FIG. 14F is a layout design of a conductive layer of the pixel circuit of the display area in the display substrate provided by some embodiments of the present disclosure.

For example, in some embodiments, the pixel circuit of the display substrate may also include a fourth conductive layer. For example, FIG. 14F shows the fourth conductive layer of the pixel circuit. As shown in FIG. 14F, the fourth conductive layer includes a second power line VDD2 and the third power line VDD3, the second power line VDD2 extends along the vertical direction in the figures, and the third power line VDD3 intersects the second power line VDD2. For example, the second power line VDD2 and the third power line VDD3 are electrically connected with each other or formed as an integrated structure.

For example, in some embodiments, the second power line VDD2 and the third power line VDD3 are electrically connected to the first power line VDD through via holes, thereby forming a meshed power line structure. This structure facilitates to reduce the resistance on the power line and thus reduce the voltage drop of the power line, and facilitates to uniformly transmit the power voltage to each of sub-pixels of the display substrate.

For example, in some embodiments, the fourth conductive layer further includes a fourth connecting portion CP4 insulated from the second power line VDD2 and the third power line VDD3, and the fourth connecting electrode 234 is electrically connected to the drain electrode D6 of the sixth transistor T6 and the light-emitting sub-pixel 1d. For example, the fourth connecting electrode 234 is implemented as the transfer electrode 133 in the above embodiment, and is electrically connected to the first electrode 112 of the light-emitting sub-pixel 1d and the drain electrode 111 of the thin film transistor.

In the display substrate provided by some embodiments of the present disclosure, a protective layer is formed on the above-mentioned fourth conductive layer, and the protective layer includes the planarization portion 116 shown in FIGS. 3 and 4, but not shown in FIGS. 14A-10E.

Figure 15A:
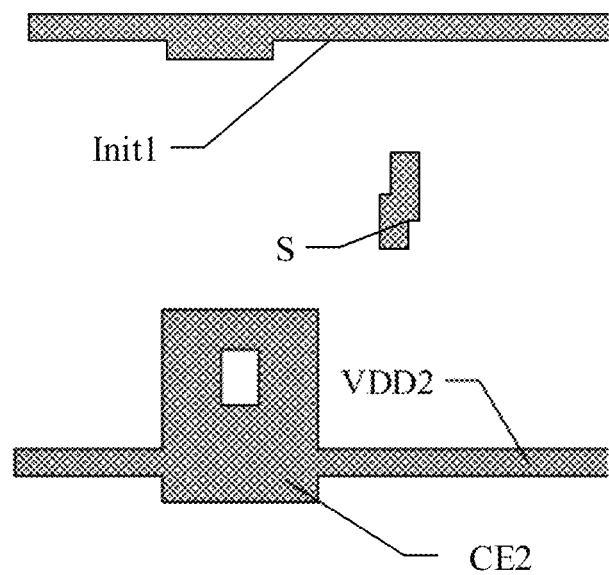
FIG. 15A is another layout design of a second conductive layer of the pixel circuit of the display area in the display substrate provided by some embodiments of the present disclosure.

For example, in some embodiments, the above-mentioned conductive layers may also be in other layouts. For example, FIG. 15A shows a design of another layout of another second conductive layer. As shown in FIG. 15A, in this example, the second conductive layer includes a second capacitor electrode CE2 (i.e., the second electrode plate 131) of the storage capacitor Cst, a reset signal line Init1, a second power signal line VDD2, and a light shield portion S. The second power signal line VDD2 and the second capacitor electrode CE2 is integrally formed.

Figure 15B:
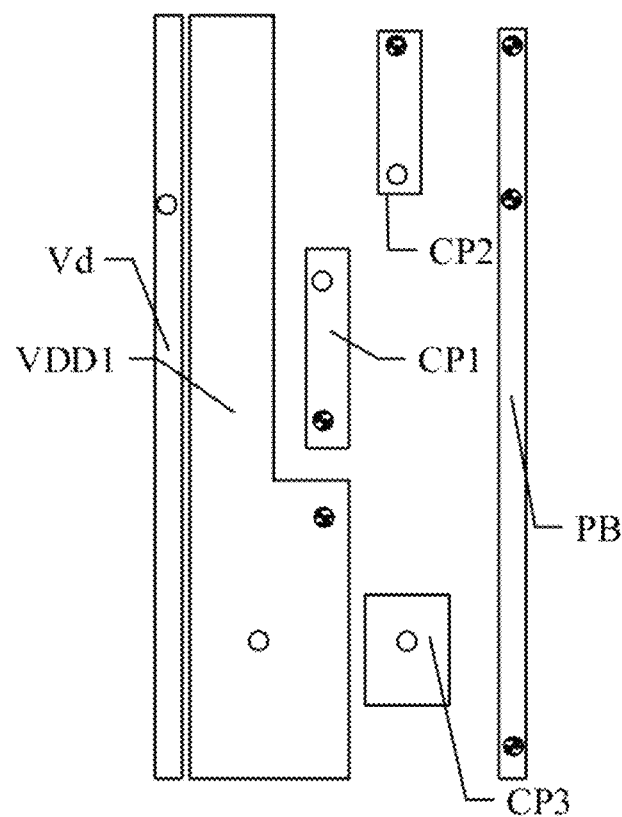
FIG. 15B is another layout design of a third conductive layer of the pixel circuit of the display area in the display substrate provided by some embodiments of the present disclosure.

For example, FIG. 15B shows another layout design of another third conductive layer diagram. As shown in FIG. 15B, the third conductive layer includes a data line Vd, a first power signal line VDD1, and a shielding line PB. The data line Vd, the first power signal line VDD1, and the shielding line PB all extend in the same direction, such as in a vertical direction in the figures. For example, the third conductive layer may also include a first connecting portion CP1, a second connecting portion CP2, and a third connecting portion CP3 used to electrically connect different wirings or electrodes.

Figure 15C:
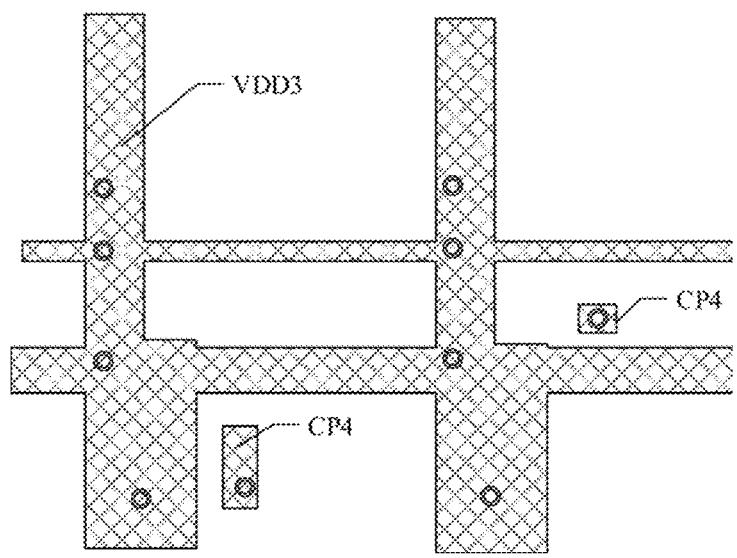
FIG. 15C is another layout design of a fourth conductive layer of the pixel circuit of the display area in the display substrate provided by some embodiments of the present disclosure.

For example, FIG. 15C shows a design of another layout of another fourth conductive layer diagram. As shown in FIG. 15C, the fourth conductive layer includes a fourth connecting portion CP4 and third power signal lines VDD3 distributed in a cross way along vertical and horizontal directions in the figures. For example, in some examples, the third power signal line VDD3 may be connected in parallel with the first power signal line VDD1, to form a meshed power structure, which is beneficial to reduce the resistance of the power signal line.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

The invention claimed is:

1. A display substrate comprising a display area, an opening area, and a transition area between the display area and the opening area, the transition area being disposed around the opening area; wherein the display substrate comprises:
   a base substrate;
   a drive circuit layer formed on the base substrate, and comprising an interlayer dielectric layer at the display area and the transition area;
   display parts located at the display area, and comprising a first electrode and a pixel definition portion sequentially formed on the interlayer dielectric layer;
   a first packaging dam located at the transition area and disposed around the opening area, wherein the first packaging dam comprises a first protective portion and a first blocking portion sequentially laminated on the interlayer dielectric layer;
   a second packaging dam located at the transition area and disposed around the opening area, wherein the second packaging dam is at a side of the first packaging dam far away from the display area, a thickness of the second packaging dam is greater than a thickness of the first packaging dam, and the second packaging dam comprises a second protective portion and a second blocking portion sequentially laminated on the interlayer dielectric layer; wherein
   the first blocking portion, the second blocking portion, and the pixel definition portion are arranged on the same layer, and are disconnected from each other;
   a distance between the first packaging dam and the second packaging dam is less than a distance between the first packaging dam and the display area;
   at least one of the first packaging dam and the second packaging dam further comprises a photo spacer formed at a side of the first blocking portion or the second blocking portion back away from the interlayer dielectric layer; and
   the display parts further comprise a supporting portion formed at a side of the pixel definition portion back away from the base substrate, the supporting portion and the photo spacer are arranged on the same layer.

2. The display substrate of claim 1, wherein a thickness of the second protective portion is greater than a thickness of the first protective portion.

3. The display substrate of claim 2, wherein the first protective portion and the first electrode are arranged on the same layer, and are disconnected from each other.

4. The display substrate of claim 2, further comprising a planarization portion located at the display area and formed between the interlayer dielectric layer and the first electrode;
wherein the first protective portion and the planarization portion are arranged on the same layer, and are disconnected from each other.

5. The display substrate of claim 3, wherein the second protective portion and the first protective portion are arranged on the same layer.

6. The display substrate of claim 3, further comprising a planarization portion located at the display area and formed between the interlayer dielectric layer and the first electrode;
wherein the second protective portion and the planarization portion are arranged on the same layer, and are disconnected from each other.

7. The display substrate of claim 1, further comprising:
an isolation area between the display area and the transition area, the isolation area being disposed around the transition area; and
an isolation column formed at a side of the interlayer dielectric layer back away from the base substrate and located at the isolation area, wherein the isolation column is disposed around the first packaging dam, and the isolation column is provided with a groove at a sidewall thereof.

8. The display substrate of claim 7, wherein the drive circuit layer comprises a thin film transistor at the display area, a source electrode and a drain electrode of the thin film transistor and the isolation column are arranged on the same layer, and are disconnected from each other.

9. The display substrate of claim 8, further comprising an inner-ring wiring area between the isolation area and the display area, the inner-ring wiring area being disposed around the isolation area;
wherein the drive circuit layer further comprises an inner-ring signal line at the inner-ring wiring area, wherein the inner-ring signal line is electrically connected to a signal wiring of the display area.

10. The display substrate of claim 8, wherein the isolation column comprises a first metal layer, a second metal layer, and a third metal layer sequentially laminated on the interlayer dielectric layer, an outer boundary of an orthographic projection of the second metal layer on the interlayer dielectric layer is inside an outer boundary of orthographic projections of the first metal layer and the third metal layer on the interlayer dielectric layer, to form the groove at the sidewall of the isolation column.

11. The display substrate of claim 10, wherein the first metal layer and the third metal layer are titanium layers, and the second metal layer is an aluminum layer.

12. The display substrate of claim 7, wherein the drive circuit layer comprises a first slot and a second slot at the isolation area; wherein the first slot is at a side of the isolation column close to the first packaging dam, and the first slot is disposed around the first packaging dam; the second slot is at a side of the isolation column close to the display area, and the second slot is disposed around the first slot;
wherein the first slot and the second slot penetrate through the drive circuit layer.

13. The display substrate of claim 1, wherein the display substrate further comprises a packaging layer comprising a first inorganic packaging film layer, an organic packaging film layer, and a second inorganic packaging film layer that are sequentially laminated;
the first inorganic packaging film layer and the second inorganic packaging film layer are configured to package the first packaging dam, the second packaging dam, and the display parts;
the organic packaging film layer is configured to package the display parts, and configured to be interrupted at a side of the first packaging dam close to the display area.

14. A display device comprising the display substrate of claim 1.

15. The display substrate of claim 1, wherein the distance between the first packaging dam and the second packaging dam is less than a distance between the second packaging dam and the opening area.

16. The display substrate of claim 1, wherein a surface roughness of the interlayer dielectric layer covered with the second protective portion is greater than a surface roughness of the interlayer dielectric layer uncovered with the second protective portion.

17. The display substrate of claim 1, further comprising a peripheral packaging area having a first peripheral packaging dam and a second peripheral packaging dam, wherein a thickness difference between the second peripheral packaging dam and the first peripheral packaging dam is greater than a thickness difference between the second packaging dam and the first packaging dam.

18. The display substrate of claim 1, wherein an inclination angle between the second packaging dam and the interlayer dielectric layer is greater than an inclination angle between the first packaging dam and the interlayer dielectric layer.

* * * * *